(12) United States Patent
Yamakido et al.

(10) Patent No.: US 7,888,981 B2
(45) Date of Patent: Feb. 15, 2011

(54) SEMICONDUCTOR INTEGRATED CIRCUIT

(75) Inventors: Kazuo Yamakido, Tokyo (JP); Takashi Nakamura, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/851,597

(22) Filed: Aug. 6, 2010

(65) Prior Publication Data

US 2010/0295585 A1  Nov. 25, 2010

Related U.S. Application Data

(62) Division of application No. 12/365,743, filed on Feb. 4, 2009, now Pat. No. 7,786,776.

(30) Foreign Application Priority Data

Feb. 6, 2008  (JP) ............................ 2008-025994

(51) Int. Cl.
*H03L 7/06* (2006.01)
(52) U.S. Cl. ...................................... 327/158; 327/149
(58) Field of Classification Search ................ 327/147, 327/149, 156, 158
See application file for complete search history.

(56) References Cited

U.S. PATENT DOCUMENTS

| | | | | |
|---|---|---|---|---|
| 5,381,116 A * | 1/1995 | Nuckolls et al. | ............ | 331/1 A |
| 6,570,454 B2 * | 5/2003 | Skierszkan | ...................... | 331/2 |
| 6,650,721 B1 * | 11/2003 | Janesch et al. | ............... | 375/376 |
| 6,691,215 B1 * | 2/2004 | Mirov et al. | ................. | 711/167 |
| 6,959,064 B2 * | 10/2005 | Spijker et al. | ............... | 375/376 |
| 7,002,415 B2 * | 2/2006 | Tsyrganovich | ............... | 331/1 R |
| 7,091,795 B1 * | 8/2006 | Tsyrganovich | ............... | 331/1 R |
| 7,123,066 B2 * | 10/2006 | Bazes | ......................... | 327/158 |
| 7,336,111 B2 * | 2/2008 | Lin et al. | ..................... | 327/158 |
| 7,463,098 B2 * | 12/2008 | Baird et al. | .................... | 331/16 |
| 7,483,508 B2 * | 1/2009 | Staszewski et al. | ......... | 375/376 |
| 7,577,231 B2 * | 8/2009 | Pomichter, Jr. | ................ | 377/47 |
| 7,605,664 B2 * | 10/2009 | Sandner et al. | ................ | 331/16 |

(Continued)

OTHER PUBLICATIONS

Guang-Kaai Dehng, "Clock-Deskew Buffer Using a SAR-Controlled Delay-Locked Loop" IEEE Journal of Solid-State Circuits, vol. 35, No. 8, pp. 1128-1136, Aug. 2000.

(Continued)

*Primary Examiner*—Lincoln Donovan
*Assistant Examiner*—Adam D Houston
(74) *Attorney, Agent, or Firm*—Miles & Stockbridge P.C.

(57) ABSTRACT

The semiconductor integrated circuit includes a clock generating section having a digital control signal generating part operable to generate a clock signal and a digital control part. The clock generating section further includes a phase-frequency comparator and a control register. The comparator is supplied with a reference signal $CLK_{in}$ and a feedback signal. The control register is supplied with an output signal of the comparator, and stores two or larger bits of digital control information. The clock generating section further includes a control data storing circuit for previously storing sets of initial set data for lock operations. In response to operation select information, initial set data are stored at upper bit of the control register from the control data storing circuit. Thus, it becomes possible to reduce the number of steps to store control information in a register for digitally controlling the clock signal generating part.

6 Claims, 9 Drawing Sheets

U.S. PATENT DOCUMENTS

| | | | | |
|---|---|---|---|---|
| 7,633,322 | B1* | 12/2009 | Zhuang et al. | 327/156 |
| 7,646,225 | B2* | 1/2010 | Song et al. | 327/156 |
| 7,786,776 | B2* | 8/2010 | Yamakido et al. | 327/158 |
| 2006/0056561 | A1* | 3/2006 | Zhang | 375/376 |
| 2009/0195275 | A1* | 8/2009 | Friedman et al. | 327/156 |
| 2009/0195277 | A1* | 8/2009 | Yamakido et al. | 327/158 |
| 2009/0244375 | A1* | 10/2009 | Moehlmann et al. | 348/512 |
| 2009/0256601 | A1* | 10/2009 | Zhang et al. | 327/156 |
| 2009/0262877 | A1* | 10/2009 | Shi et al. | 375/376 |
| 2009/0267664 | A1* | 10/2009 | Uozumi et al. | 327/158 |
| 2010/0007389 | A1* | 1/2010 | Li et al. | 327/153 |
| 2010/0225367 | A1* | 9/2010 | Murali et al. | 327/156 |

OTHER PUBLICATIONS

Robert Bogdan Staszewski, "Digitally Controlled Oscillator (DCO)-Based Architecture for RF Frequency Synthesis in a Deep-Submicrometer CMOS Process", IEEE Transactions on Circuits and Systems-II: Analog and Digital Signal Processing, vol. 50, No. 11, Nov. 2003, pp. 815-828.

Rafael Fried "A High Resolution Frequency Multiplier for Clock Signal Generation", IEEE Journal of Solid-State Circuits, vol. 31, No. 7, Jul. 1996, pp. 1059-1062.

* cited by examiner $$f_{osc} = 1/2N \cdot td = M \cdot f_{REF}$$
$$f_{REF} = 1/2N \cdot M \cdot td = const$$

SEMICONDUCTOR INTEGRATED CIRCUIT

CLAIM OF PRIORITY

This application is a division of application Ser. No. 12/365,743 filed Feb. 4, 2009 now U.S. Pat. No. 7,786,776. The present application also claims priority from Japanese application JP 2008-25994 filed on Feb. 6, 2008, the content of which is hereby incorporated by reference into this application.

FIELD OF THE INVENTION

The present invention relates to a semiconductor integrated circuit, and particularly to a technique beneficial for reducing a group of steps for storing two or larger bits of digital control information in a register for digitally controlling a clock signal generating part.

BACKGROUND OF THE INVENTION

As to LSIs including System On Chip (SOC) and microcomputers (MC), larger-scale integration, higher functionality and higher-speed operation have been achieved with the rapid progress in semiconductor manufacturing techniques. However, on the other hand, the demands for subtle power management to suppress the increase in leak current on standby and high-speed restore are growing particularly in regard to battery-driven portable devices and something of that sort. Specifically, the operation of an internal circuit of LSI to reduce leak current on standby must include shift to a sleep mode in which supply of a clock to the internal circuit is stopped on standby, and rapid resumption of the clock supply at the time of making the internal circuit resume working in an active mode.

Clock generating circuits based on the frequency of a clock input signal and/or the phase of the pulse edge are roughly classified into the following three circuits.

The first circuit is PLL (Phase Locked Loop). The frequency of an output clock thereof is a multiple of the frequency of an input clock in general. PLL incorporates a phase comparator and a variable-phase circuit. Therefore, in PLL, control is performed so that the phase of a feedback clock resulting from frequency division of an output clock, by which the frequency is made equal to the output clock frequency times the reciprocal of a multiplication number, is essentially made coincident with (or locked to) the phase of an input clock.

The second circuit is DLL (Delay Locked Loop), which delays an input clock thereby produce an output clock. DLL incorporates a phase comparator and a variable delay circuit, by which control is performed so that the phase of an output clock produced by the variable delay circuit is behind by a fixed value with respect to the phase of an input clock essentially.

The third circuit is FLL (Frequency Locked Loop). The frequency of an output clock thereof is a multiple of the frequency of an input clock in general. FLL incorporates a frequency comparator and a variable-frequency circuit, by which control is performed so that the frequency of a feedback clock resulting from frequency division of an output clock, by which the frequency is made equal to the output clock frequency times the reciprocal of a multiplication number, is essentially locked to the frequency of an input clock. For an input clock to FLL, a relatively low frequency (about 32 kHz) generated by e.g. a quartz oscillator for RTC (Real Time Clock) is used. In general, FLL performs control so that only the frequency of an output clock multiplied with a multiplication number of a one-step higher level in comparison to PLL is made a fixed value. Therefore, the pulse edge of a feedback clock resulting from frequency division of the output clock, by which the frequency is equal to the output clock frequency times the reciprocal of a multiplication number, is not necessarily locked to the phase of edge of the input reference clock. However, FLL can be constructed with only a basic logic cell circuit readily, and therefore its output clock of a high frequency, which can be varied appropriately, can be used as a reference clock of original oscillation.

Of the circuits described above, a PLL (Phase Locked Loop) circuit is often used to reduce the skew of a clock signal arising at the time of distributing the clock signal an internal circuit of LSI. In general, a PLL circuit includes a phase-frequency comparator, a combination of charge pump and loop filter modules, a voltage or current control oscillator, and an analog circuit used as a buffer. In a PLL circuit, a clock input signal and a clock output signal of the buffer are supplied to the phase-frequency comparator, and an output of the phase-frequency comparator is supplied to the voltage or current control oscillator through the combination of charge pump and loop filter modules, whereby the phase difference between the clock input signal and clock output signal is made zero outwardly and thus the skew of the clock signal is reduced.

In the sleep mode of the internal circuit of LSI, clock supply by a PLL circuit is stopped, whereas the clock supply by the PLL circuit is resumed at the time of resuming the operation of the internal circuit in the active mode. However, to make the PLL circuit resume the clock supply, a lock time (settling time) until the frequency reaches a target frequency to become stable is needed, and high-speed restore from the sleep mode to active mode is needed.

PLL and DLL (Delay Locked Loop) for resolving the problem of skew of clocks are disclosed by Guang-Kaai Dehng et al., "Clock-Deskew Buffer Using a SAR-Controlled Delay-Locked Loop", IEEE JOURNAL OF SOLID-STATE CIRCUITS, VOL. 35, NO. 8, PP. 1128-1136, AUGUST 2000. It further contains the description about an analog DLL and a digital DLL, and discloses the following points. Analog DLLs are not suitable for future low-power applications because sufficient delay time cannot be achieved with a low source voltage. In addition, analog DLLs tend to be affected by the variation of a manufacturing process and are vulnerable to noise coming from a power source. Digital DLLs are resistant to influences of noise coming from a power source, a manufacturing process, a voltage, a temperature, and a load (PVTL). Also, digital DLLs are lower in standby current consumption and shorter in lock time in comparison to analog DLLs.

Further, Guang-Kaai Dehng et al. disclose a binary search algorithm (a binary search method) to reduce a search time for lock by a digital DLL, and a digital DLL for successive approximation register (SAR) control which has a faster lock time in comparison to digital DLLs for register control and counter control. Also, it is described that in case of using 6-bit delay line, the digital DLL for SAR control ideally has a lock time of 6-clock cycle, and maintains tight synchronization even with a long clock distribution length, and makes possible to shorten the lock time.

A digital control oscillator used for a digital PLL disclosed by Robert Bogdan Staszewski et al, "Digitally Controlled Oscillator (DCO)-Based Architecture for RF Frequency Synthesis in a Deep-Submicron CMOS Process", IEEE TRANSACTIONS ON CIRCUITS AND SYSTEMS-II: ANALOG AND DIGITAL SIGNAL PROCESSING, VOL. 50, NO. 11, NOVEMBER 2003 PP. 815-828. The oscillator includes lots of quantized capacitances digitally controlled in an LC-tank of the oscillator.

Still further, a frequency multiply circuit is disclosed by Rafael Fried et al, "A High Resolution Frequency Multiplier for Clock Signal Generation", IEEE JOURNAL OF SOLID-STATE CIRCUITS, VOL. 31, NO. 7, PP. 1059-1062, July 1996, which has a digital control oscillator including a highly accurate 14-bit current output type digital-to-analog conversion circuit (DAC) and which uses a binary search algorithm to lock an output clock to a frequency resulting from multiplication by a large multiplication number from the RTC frequency of an input clock. The RTC frequency is 32768 kHz, and the frequency resulting from the multiplication by the large multiplication number on the frequency of the output clock ranges 40 to 60 MHz.

Now, as well known, in a successive comparison type A/D converter, a successive approximation register (SAR) is connected between an output of a comparator and an input of a local D/A converter, and an analog input signal and an analog output signal of the local D/A converter are supplied to one input terminal of the comparator and the other input terminal thereof. Data held by the successive approximation register (SAR) is successively updated according to the binary search method so that the level of the analog output signal of the local D/A converter is coincident with the level of the analog input signal. Thus, digital conversion output signal of the analog input signal can be gained from the successive approximation register.

SUMMARY OF THE INVENTION

Prior to the invention, the inventors had been engaged in development of FLL (Frequency-Locked Loop) for clock distribution, which is mounted on LSIs of System-on-chip (SOC) and microcomputer (MC), etc.

FIG. 1 is a diagram showing a configuration of FLL examined by the inventors prior to the invention.

The FLL includes a frequency comparison part (FC) 30, a digital control part 20, and a digital control oscillator (DCO) 10 in the form of a circuit of a delay ring oscillating part.

The digital control oscillator 10 includes a two-input NAND gate 11 having one input supplied with a reset signal Reset, a digital control variable delay circuit 12 including N−1 delay cells having a unit delay amount td, and an output buffer 13. The number N−1 of delay stages of the digital control variable delay circuit 12 is set to an appropriate value between a minimum value of 0 and a maximum value of 31 under the control of the digital control part 20. Also, the two-input NAND gate 11 has a unit delay amount td. Therefore, the total delay time N·td of the two-input NAND gate 11 in the form of a circuit of the delay ring oscillating part and the digital control variable delay circuit 12 can be set within a range between a minimum delay time 1·td and a maximum delay time 32·td.

Changing the reset signal Rset from Low level "0" to High level "1" at one input terminal of the two-input NAND gate 11 makes active the closed loop of the delay ring oscillating part, whereby an oscillation clock signal CLKm is produced. The oscillation clock signal CLKm is supplied to an input terminal of the output buffer 13. Then, an oscillation clock output signal $CLK_{out}$ is produced and let out of an output terminal thereof. The oscillation frequency $f_{osc}$ of the oscillation clock signal CLKm produced by the digital control oscillator 10 is given by the following expression depending on the set delay stage umber N of a delay closed loop including the two-input NAND gate 11 and digital control variable delay circuit 12, and the unit delay amount td.

$$f_{osc}=1/(2 \cdot N \cdot td) \tag{Expression 1}$$

The digital control part 20 includes a decoder 21, a successive approximation register (SAR) 22, and a control clock generating circuit (CCG) 23. The bit number of the successive approximation register (SAR) 22 may be 12, whereby delay control up to the maximum 4096 can be performed in theory. However, the bit number of the successive approximation register (SAR) 22 is arranged to be 11 so that the variable multiplication number M of a program counter (PC) 32 of the frequency comparison part (FC) 30 can be set up to the maximum 2047, in consideration of the change in delay amount of delay cells owing to fluctuations of PVT (Process, Voltage and Temperature). For the sake of simplicity, the bit number of the successive approximation register 22 shall be five here. To a data input terminal of the 5-bit successive approximation register (SAR) 22, a comparison output signal $FD_{out}$ is supplied from a frequency comparator 31 of the frequency comparison part 30. To six timing control terminals of the successive approximation register 22 (SAR), six timing control signals cks0-sks5 are supplied from the control clock signal generating circuit (CCG) 23. Further, to an input terminal of the control clock signal generating circuit (CCG) 23, an input clock signal $CLK_{in}$ is supplied as a reference frequency signal. Five bits of output data Q1-Q5 of the successive approximation register (SAR) 22 are supplied to five input terminals of the decoder 21. 32 decode output signals from the decoder 21 are supplied to the digital control variable delay circuit 12 of the digital control oscillator 10.

The frequency comparison part 30 includes the frequency comparator (FD) 31 and the program counter (PC) 32. The program counter (PC) 32 counts the clock number of oscillation clock signals CLKm produced by the digital control oscillator 10. The program counter (PC) 32 outputs an output signal $M_{out}$ of Low level "0" until the clock number of oscillation clock signals CLKm reaches a set multiplication number. When the clock number reaches the multiplication number, the program counter outputs an output signal $M_{out}$ of High level "1". To one input terminal of the frequency comparator 31, the input clock signal $CLK_{in}$ is supplied as a reference frequency signal; to the other input terminal, the output signal $M_{out}$ is supplied from the program counter 32. The comparison output signal $FD_{out}$ of the frequency comparator 31 is supplied to the successive approximation register (SAR) 22 of the digital control part 20 as a value corresponding to Low level "0" or High level "1" of the output signal $M_{out}$ of the program counter 32 at the time of input of the input clock signal $CLK_{in}$. The multiplication number M of the program counter 32 can be variably set by multiplication number setting data supplied through the input terminal Min for setting a multiplication number.

FIG. 2 is a diagram showing a configuration of the digital control variable delay circuit 12 of the digital control oscillator 10 of FLL shown in FIG. 1. The digital control variable delay circuit 12 includes 32 a set of delay units DU0-DU31 and 32 switches SW0-SW31, which is connected with the output of the two-input NAND gate 11 of the digital control oscillator 10. The 32 delay units DU0-DU31 each have a unit delay amount td. The 32 delay units DU0-DU31 connected in series are connected between the output terminal and other input terminal of the two-input NAND gate 11. The 32 switches SW0-SW31 are connected between an output node where the oscillation clock signal CLKm arises and 32 input terminals of the 32 delay units DU0-DU31. Control inputs of the 32 switches SW0-SW31 are driven by 32 output signals Out0-Out31 of the decoder 21 of the digital control part 20.

In response to 32 output signals Out0-Out31 of the decoder 21, which is supplied with 5-bit output data Q1-Q5 of the successive approximation register 22 of the digital control part 20, only one switch selected from among the 32 switches SW0-SW31 is controlled to ON state, and other 31 switches are controlled to OFF state. The set delay stage umber N of the delay closed loop including the two-input NAND gate 11 and digital control variable delay circuit 12, which is given by Expression 1, is set depending on the place of the one switch controlled to ON state. In case that the first switch SW0 is controlled to ON state, the set delay stage umber N is set to a minimum of one, and the oscillation frequency $f_{osc}$ of the digital control oscillator 10 is made a maximum oscillation frequency $f_{osc}(max)=1/(2 \cdot td)$. In case that the last switch SW31 is controlled to ON state, the set delay stage umber N is set to a maximum of 32, and the oscillation frequency $f_{osc}$ of the digital control oscillator 10 is made a minimum oscillation frequency $f_{osc}(mini)=1/(64 \cdot td)$.

Therefore, the FLL circuit shown in FIG. 1 can set the frequency of a clock signal supplied to the LSI internal circuit variably. Even in case that the frequency $f_{REF}$ of the input clock signal $CLK_{in}$ as used a reference frequency signal is constant, the oscillation frequency $f_{osc}$ of the digital control oscillator 10 can be changed by variably setting the multiplication number M of the program counter 32.

In other words, in case that the frequency of the input clock signal $CLK_{in}$ making a reference frequency signal of the frequency $f_{REF}$ to the one input terminal of the frequency comparator 31 agrees with the frequency of the output signal $M_{out}$ at the other input terminal, which depends on the result of the count and which is sent from the program counter 32 of the variable multiplication number M, the relation given by the following expression holds.

$$f_{REF}=f_{osc}/M \quad \text{(Expression 2)}$$

Therefore, the following relation holds from Expressions 1 and 2.

$$f_{osc}=1/(2 \cdot N \cdot td)=M \cdot f_{REF} \quad \text{(Expression 3)}$$

$$f_{REF}=1/(2 \cdot N \cdot M \cdot td) \quad \text{(Expression 4)}$$

That is, the set delay stage umber N of the digital control oscillator 10 can be changed to produce an oscillation frequency $f_{osc}$ of M times the reference frequency $f_{REF}$ by setting the multiplication number M of the program counter 32 variably. Hence, in case that the multiplication number M of the program counter 32 is increased, data held by the successive approximation register (SAR) 22 of the digital control part 20 are updated successively so that the reference frequency $f_{REF}$ in the frequency comparator 31 and the frequency of an output signal $M_{out}$ from the program counter 32 with a variable multiplication number M are coincident with each other. Consequently, as is clear from Expression 3, the increase in the multiplication number M of the program counter 32 increases the frequency multiplication number of the reference frequency $f_{REF}$, and in inverse proportion to it, the set delay stage umber N of the digital control oscillator 10 decreases.

The actual bit number of the successive approximation register 22 is 12. Therefore, the variable multiplication number M of the program counter 32 of the frequency comparison part 30, which has a 11-bit structure, can be set to up to the maximum 2047. For example, in case that the variable multiplication number M of the program counter 32 is set to the maximum 2047 on the assumption that the reference frequency $f_{REF}$ of the input clock signal $CLK_{in}$ is 30 kHz, the oscillation frequency $f_{osc}$ of the digital control oscillator 10 is about 60 MHz, and thus the internal circuit of LSI works at a high speed. Also, in case that the variable multiplication number M is set to approximately a half the value 1028, the oscillation frequency $f_{osc}$ is about 30 MHz, and thus the internal circuit of LSI works at a middle speed. Further, in case that the variable multiplication number M is set to approximately a tenth of the value, 205, the oscillation frequency $f_{osc}$ is about 6 MHz, and thus the internal circuit of LSI works at a low speed.

Now, the way the successive approximation register (SAR) 22 decides the set delay stage umber N of the digital control oscillator 10 will be described below. Here, it is assumed that reference frequency $f_{REF}$ of the input clock signal $CLK_{in}$ and the multiplication number M of the program counter 32 are set to certain values and the unit delay amount td of the digital control oscillator 10 has been known.

FIG. 3 is a diagram for explaining the way the successive approximation register (SAR) 22 decides the set delay stage umber N of the digital control oscillator 10 when the reference frequency $f_{REF}$, multiplication number M and unit delay amount td have been known, in FLL shown in FIG. 1, which has been examined by the inventors prior to the invention. Incidentally, the algorithm to decide the set delay stage umber N in the case of FIG. 3 is based on the binary search algorithm (binary search method) described in "Clock-Deskew Buffer Using a SAR-Controlled Delay-Locked Loop" presented by Guang-Kaai Dehng et al.

FIG. 5 is a diagram showing configurations of the successive approximation register (SAR) 22 and control clock generating circuit (CCG) 23 in the digital control part 20 for deciding the set delay stage umber N of the digital control oscillator 10 in FLL shown in FIG. 1, which has been examined by the inventors prior to the invention.

As in FIG. 5, the successive approximation register (SAR) 22 includes five flip-flops FF1-FF5, each having a data input terminal D. To the data input terminals D, the comparison output signal $FD_{out}$ from the frequency comparator 31 of the frequency comparison part 30 is supplied commonly. To the successive approximation register (SAR) 22, multi-clock signals cks0-cks5 generated by the control clock generating circuit (CCG) 23 are supplied.

The first clock signal cks0 from the control clock generating circuit (CCG) 23 is supplied to a set terminal S1 of the first flip-flop FF1, and reset terminals R of the second flip-flop FF2 to fifth flip-flop FF5. The second clock signal cks1 from the control clock generating circuit (CCG) 23 is supplied to a clock terminal C1 of the first flip-flop FF1 and a set terminal S2 of the second flip-flop FF2. The third clock signal cks2 from the control clock generating circuit (CCG) 23 is supplied to a clock terminal C2 of the second flip-flop FF2 and a set terminal S3 of the third flip-flop FF3. The fourth clock signal cks3 from the control clock generating circuit (CCG) 23 is supplied to a clock terminal C3 of the third flip-flop FF3 and a set terminal S4 of the fourth flip-flop FF4. The fifth clock signal cks4 from the control clock generating circuit (CCG) 23 is supplied to a clock terminal C4 of the fourth flip-flop FF4 and a set terminal S5 of the fifth flip-flop FF5. The sixth clock signal cks5 from the control clock generating circuit (CCG) 23 is supplied to a clock terminal C5 of the fifth flip-flop FF5.

As in FIG. 5, the control clock generating circuit (CCG) 23 includes four flip-flops FF6-FF9 and six AND gates AND1-AND6. The input clock signal $CLK_{in}$ used as a reference frequency signal is supplied to a clock terminal C of the first flip-flop FF6, fourth input terminals of the first to fifth AND gates AND1-AND5, and a second input terminal of the sixth AND gate AND6. An output from an inverted-data output terminal Dq1b of the first flip-flop FF6 is supplied to a data input terminal D of the first flip-flop FF6, a clock terminal C of the second flip-flop FF7, and third input terminals of the first, third and fifth AND gates AND1, AND3 and AND5. An output from a noninverted-data output terminal Dq1 of the first flip-flop FF6 is supplied to third input terminals of the second and fourth AND gates AND2 and AND4. An output from an inverted-data output terminal Dq2b of the second flip-flop FF7 is supplied to a data input terminal D of the second flip-flop FF7, a clock terminal C of the third flip-flop FF7, and second input terminals of the first, second and fifth AND gates AND1, AND2 and AND5. An output from a noninverted-data output terminal Dq2 of the second flip-flop FF7 is supplied to second input terminals of the third and fourth AND gates AND3 and AND4. An output from an inverted-data output terminal Dq3b of the third flip-flop FF8 is supplied to a data input terminal D of the third flip-flop FF8, and first input terminals of the first to fourth AND gates AND1-AND4. An output from a noninverted-data output terminal Dq3 of the third flip-flop FF8 is supplied to a first input terminal of the fifth AND gate AND5. The first to fifth clock signals cks0-cks4 arise from output gates of the first to fifth AND gates AND1-AND5 and are supplied to the successive approximation register (SAR) 22. The fifth clock signal cks4 arising from the output terminal of the fifth AND gate AND5 is supplied to a clock terminal C of the fourth flip-flop FF9 through an inverter INV. To a data input terminal D of the fourth flip-flop FF9, High level "1" of a source voltage Vdd is supplied. An output from the noninverted-data output terminal Dq4 of the fourth flip-flop FF9 is supplied to a first input terminal of the sixth AND gate AND6. The six clock signal cks5 arises from an output terminal of the sixth AND gate AND6, and is supplied to a clock terminal C5 of the fifth flip-flop FF5 of the successive approximation register (SAR) 22. In addition, the first clock signal cks0 arising from an output terminal of the first AND gate AND1 is supplied to reset terminals R of the first to fourth flip-flops FF6-FF9.

FIG. 6 is a diagram showing waveforms in the successive approximation register (SAR) 22 and control clock generating circuit (CCG) 23 in the digital control part 20 shown in FIG. 5, illustrating the way the set delay stage umber N of the digital control oscillator 10 is decided in FLL of FIG. 1.

It is assumed that supply of the input clock signal $CLK_{in}$ having a reference frequency $f_{REF}$ to FLL shown in FIG. 1 has been already started, and at Step 0 of FIG. 6, the multiplication number M of the program counter 32 is set to a predetermined value, and a lock operation of FLL shown in FIG. 1 is started. First, in an initial condition before Step 0, the noninverted-data output terminals Dq1-Dq3 of the three flip-flops FF6-FF8 of the control clock generating circuit (CCG) 23 are all at Low level "0", and the inverted-data output terminals Dq1b-Dq3b are all at High level "1".

In this condition, the input clock signal $CLK_{in}$ of High level "1" is supplied to the control clock generating circuit (CCG) 23 in keeping with the timing of Step 0, whereby the first clock signal cks0 of High level "1" arises from the output terminal of the first AND gate AND1. The first clock signal cks0 of High level "1" arising from the output terminal of the first AND gate AND1 is commonly supplied to the reset terminals R of the four flip-flops FF6-FF9, and therefore the four flip-flops FF6-FF9 are all driven into reset states. As a result, the noninverted-data output terminals Dq1-Dq4 of the four flip-flops FF6-FF9 are all made Low level "0", and the inverted-data output terminals Dq1b-Dq3b of the three flip-flops FF6-FF8 are all made High level "1".

When the input clock signal $CLK_{in}$ is changed from Low level "0" to High level "1" at the subsequent Step 1, the flip-flop FF6 in the first stage of the control clock generating circuit 23 is driven into its set state in response to High level "1" applied to the inverted-data output terminal Dq1b of the first-stage flip-flop FF6, and therefore the data input terminal D thereof. Therefore, in keeping with the timing of Step 1, the noninverted-data output terminal Dq1 of the flip-flop FF6 in the first stage is changed from Low level "0" to High level "1", and the second clock signal cks1 of High level "1" arises from the output terminal of the second AND gate AND2.

When the input clock signal $CLK_{in}$ is changed from Low level "0" to High level "1" at the time of subsequent Step 2, the flip-flop FF6 in the first stage of the control clock generating circuit 23 is driven into its reset state in response to Low level "0" applied to the inverted-data output terminal Dq1b of the first-stage flip-flop FF6, and therefore the data input terminal D thereof. Therefore, in keeping with the timing of Step 2, the inverted-data output terminal Dq1b of the flip-flop FF6 in the first stage is changed from Low level "0" to High level "1". In parallel, the flip-flop FF7 in the second stage is driven into its set stage in response to High level "1" applied to the inverted-data output terminal Dq1b of the second-stage flip-flop FF7, and therefore the data input terminal D thereof. In keeping with the timing of Step 2, the noninverted-data output terminal Dq2 of the flip-flop FF7 in the second stage is changed from Low level "0" to High level "1", and the third clock signal cks2 of High level "1" arises from the output terminal of the third AND gate AND3.

Further, when the input clock signal $CLK_{in}$ is changed from Low level "0" to High level "1" at the time of subsequent Step 3, the flip-flop FF6 in the first stage of the control clock generating circuit 23 is driven into the set stage in response to High level "1" applied to the inverted-data output terminal Dq1b of the first-stage flip-flop FF6, and the data input terminal D thereof. Therefore, in keeping with the timing of Step 3, the noninverted-data output terminal Dq1 of the flip-flop FF6 in the first stage is changed from Low level "0" to High level "1", whereas the flip-flop FF7 in the second stage is kept in the set state, the flip-flop FF8 of the third stage is left staying in the reset state. Hence, in keeping with the timing of Step 3, the fourth clock signal cks3 of High level "1" arises from the output terminal of the fourth AND gate AND4.

Still further, when the input clock signal $CLK_{in}$ is changed from Low level "0" to High level "1" at the time of subsequent Step 4, the flip-flop FF6 in the first stage of the control clock generating circuit 23 is driven into the reset state in response to Low level "0" applied to the inverted-data output terminal Dq1b of the fist-stage flip-flop FF6, and the data input terminal D thereof. Therefore, in keeping with the timing of Step 4, the inverted-data output terminal Dq1b of the flip-flop FF6 in the first stage is changed from Low level "0" to High level "1", the flip-flop FF7 in the second stage is driven into the reset state in response to Low level "0" applied to the inverted-data output terminal Dq2b of the second-stage flip-flop FF7, and therefore the data input terminal D thereof. When the noninverted-data output terminal Dq2 of the flip-flop FF7 in the second stage is changed from Low level "0" to High level "1" in keeping with the timing of Step 4, the flip-flop FF8 in the third stage is driven into the set state in response to High level "1" applied to the inverted-data output terminal Dq3b of the third-stage flip-flop FF8, and therefore the data input terminal D. Thus, in keeping with the timing of Step 4, the fifth clock signal cks4 of High level "1" arises from the output terminal of the fifth AND gate AND5.

When the input clock signal $CLK_{in}$ is changed from High level "1" to Low level "0" between Step 4 and Step 5, the fifth clock signal cks4 at the output terminal of the fifth AND gate AND5 is also changed from High level "1" to Low level "0". Thus, the signal supplied to the clock terminal C of the fourth flip-flop FF9 through the inverter INV is changed from Low level "0" to High level "1", and therefore the fourth flip-flop FF9 is driven into the set state according to High level "1" of the source voltage Vdds applied to the data input terminal D. Consequently, the noninverted-data output terminal Dq4 of the fourth flip-flop FF9 is kept at High level "1". Also, at a step after Step 5, the sixth clock signal cks5 at the output terminal of the sixth AND gate AND6 is changed between High level "1" and Low level "0" in response to the change in the input clock signal $CLK_{in}$ between High level "1" and Low level "0".

On the other hand, the first clock signal cks0 of High level "1" initially produced in keeping with the timing of first Step 0 is supplied to the set terminal S1 of the first flip-flop FF1 of the successive approximation register (SAR) 22, and the reset terminals R of the second to fifth flip-flops FF2-FF5. Hence, at the time of Step 0, in the successive approximation register (SAR) 22, the first flip-flop FF1 is driven into the set state, and other second to fifth flip-flops FF2-FF5 are driven into the reset states. As a result, five bits of output data Q1-Q5 supplied to the decoder 21 from the successive approximation register (SAR) 22 make a control word having an initial code of "10000".

Then, the decoder 21 shown in FIG. 2 responds to five bits of output data Q1-Q5 having the code of "10000" from the successive approximation register (SAR) 22, and makes only one output signal Out16 selected from among the 32 output signals Out0-Out31 High level "1" and all the other output signals Low level "0". As a result, only one switch SW16 located in the middle of the 32 switches SW0-SW31 in the digital control variable delay circuit 12 of the digital control oscillator 10 shown in FIG. 2 is controlled to ON state, and all the other switches are controlled to OFF state. The set delay stage umber N of the delay closed loop constituted by the two-input NAND gate 11 and digital control variable delay circuit 12 of the digital control oscillator 10 at that time is 16 at the middle between the minimum 1 and the maximum 32. Therefore, the digital control oscillator 10 starts oscillating at an oscillation frequency $f_{osc}=1/(2 \cdot 16 \cdot td)$. Now, it is noted that the unit delay amount td fluctuates under the influences of the variation in a manufacturing process of LSI, and the fluctuations in the source voltage and temperature.

In FLL shown in FIG. 1, when the digital control oscillator 10 starts the first oscillating action, the clock number of the oscillation clock signals CLKm is counted according to the variable multiplication number M previously set in the program counter 32. The frequency comparator 31 is supplied with the input clock signal $CLK_{in}$ used as a reference frequency signal and the output signal $M_{out}$ representing a result of the count of the clock number from the program counter 32 respectively. The comparison output signal $FD_{out}$ output from the frequency comparator 31 is supplied to the successive approximation register (SAR) 22 of the digital control part 20 as a signal of Low level "0" or High level "1" corresponding to the level of the output signal $M_{out}$ from the program counter 32 at the time of input of the input clock signal $CLK_{in}$. The frequency of the oscillation clock signal CLKm can become lower or higher than a target frequency depending on the fluctuation in the unit delay amount td. In case that the frequency is lower, the comparison output signal $FD_{out}$ from the frequency comparator 31 is of Low level "0", whereas in case that the frequency proceeds and is higher, the comparison output signal $FD_{out}$ of the frequency comparator 31 is of High level "1".

The signal level of the comparison output signal $FD_{out}$ represents whether the frequency resulting from the first oscillating action of the digital control oscillator 10 of FLL of FIG. 1 utilizing the initial code "10000" offered by the successive approximation register (SAR) 22 is lower or higher, and is stored in the first flip-flop FF1 of the successive approximation register (SAR) 22 as follows. The signal level of the comparison output signal $FD_{out}$ is stored through the data input terminal D in response to High level "1" of the second clock signal cks1 supplied to the clock terminal C1 of the first flip-flop FF1 of FIG. 5 in keeping with the timing of Step 1 of FIG. 6. For example, the first flip-flop FF1 is reset by Low level "0" when the frequency of the oscillation clock CLKm is lower, and therefore the first bit output data Q1 of the successive approximation register (SAR) 22 becomes Low level "0". In addition, as the first flip-flop FF1 is set by High level "1" when the frequency is higher, the first bit output data Q1 of the successive approximation register (SAR) 22 becomes High level "1". In either case, the second clock signal cks1 of High level "1" is supplied to the set terminal S2 of the second flip-flop FF2, and therefore the second bit output data Q2 of the second bit of the successive approximation register (SAR) 22 becomes High level "1". The third to fifth bit output data Q3-Q5 of the successive approximation register (SAR) 22 are kept in the form of a data code of "000".

Step 1 of FIG. 3 shows bit patterns of the first bit output data Q1 of the successive approximation register 22 using the comparison output signal $FD_{out}$ resulting from the first oscillating action of the digital control oscillator of FLL utilizing the initial code "10000" from the successive approximation register 22 at Step 0, which reflect whether the frequency is lower or higher. The first bit output data Q1 of Low level "0" shows the fact that the frequency is lower. The control code of the successive approximation register 22 is changed to "01000", and the second oscillating action of the digital control oscillator of FLL of Step 2 is started. The first bit output data Q1 of High level "1" shows the fact that the frequency is higher. Then, the control code of the successive approximation register 22 is changed to "11000", and the second oscillating action of the digital control oscillator of FLL of Step 2 is started.

In case that in FLL shown in FIG. 1, the digital control oscillator 10 starts the second oscillating action at Step 2 of FIG. 6, the signal level of the comparison output signal $FD_{out}$ which shows whether the frequency resulting from the second oscillating action is lower or higher, is stored in the second flip-flop FF2 of the successive approximation register (SAR) 22 as follows. That is, the signal level of the comparison output signal $FD_{out}$ is stored through the data input terminal D in response to High level "1" of the third clock signal cks2 supplied to the clock terminal C2 of the second flip-flop FF2 of FIG. 5 in keeping with the timing of Step 2 of FIG. 6. For example, the second flip-flop FF2 is reset by Low level "0" in case of the lower frequency, and therefore the second bit output data Q2 from the successive approximation register (SAR) 22 becomes Low level "0". In addition, the second flip-flop FF2 is set by High level "1" in case of the higher frequency, and therefore the second bit output data Q2 of the successive approximation register (SAR) 22 becomes High level "1". In either case, the third clock signal cks2 of High level "1" is supplied to the set terminal S3 of the third flip-flop FF3, and therefore the third bit output data Q4 of the successive approximation register (SAR) 22 becomes High level "1". In addition, the fourth and fifth bit output data Q4 and Q5 of the successive approximation register (SAR) 22 are kept in the form of a data code of "00".

Step 2 of FIG. 3 shows bit patterns of the second bit output data Q2 of the successive approximation register 22 using the comparison output signal $FD_{out}$ resulting from the second oscillating action utilizing the control code "01000" or "11000" from the successive approximation register 22 at Step 1, which reflect whether the frequency is lower or higher. The second bit output data Q2 of Low level "0" shows the fact that the frequency is lower. The control code of the successive approximation register 22 is changed to "00100" or "10100", and the third oscillating action of the digital control oscillator of FLL of Step 3 is started. The second bit output data Q2 of High level "1" shows the fact that the frequency is higher. Then, the control code of the successive approximation register 22 is changed to "01100" or "11100", and the third oscillating action of the digital control oscillator of FLL of Step 3 is started.

In case that in FLL shown in FIG. 1, the digital control oscillator 10 starts the third oscillating action at Step 3 of FIG. 6, the signal level of the comparison output signal $FD_{out}$, which shows whether the frequency resulting from the third oscillating action is lower or higher, is stored in the third flip-flop FF3 of the successive approximation register (SAR) 22 as follows. That is, the signal level of the comparison output signal $FD_{out}$ is stored through the data input terminal D in response to High level "1" of the fourth clock signal cks3 supplied to the clock terminal C3 of the third flip-flop FF3 of FIG. 5 in keeping with the timing of Step 3 of FIG. 6. For example, the third flip-flop FF3 is reset by Low level "0" in case of the lower frequency, and therefore the third bit output data Q3 from the successive approximation register (SAR) 22 becomes Low level "0". In addition, the third flip-flop FF3 is set by High level "1" in case of the higher frequency, and therefore the third bit output data Q3 of the successive approximation register (SAR) 22 becomes High level "1". In either case, the fourth clock signal cks3 of High level "1" is supplied to the set terminal S4 of the fourth flip-flop FF4, and therefore the fourth bit output data Q4 of the successive approximation register (SAR) 22 becomes High level "1". In addition, the fifth bit output data Q5 of the successive approximation register (SAR) 22 is kept in the form of a data code of "0".

Step 3 of FIG. 3 shows bit patterns of the third bit output data Q3 of the successive approximation register 22 using the comparison output signal $FD_{out}$ resulting from the second oscillating action utilizing any of the control codes "00100", "01100", "10100" and "11100" from the successive approximation register 22 at Step 2, which reflect whether the frequency is lower or higher. The third bit output data Q3 of Low level "0" shows the fact that the frequency is lower. The control code of the successive approximation register 22 is changed to one of the four control codes on the left, and the fourth oscillating action of the digital control oscillator of FLL of Step 4 is started. The third bit output data Q3 of High level "1" shows the fact that the frequency is higher. Then, the control code of the successive approximation register 22 is changed to one of the four control codes on the right, and the fourth oscillating action of the digital control oscillator of FLL of Step 4 is started.

In case that in FLL shown in FIG. 1, the digital control oscillator 10 starts the fourth oscillating action at Step 4 of FIG. 6, the signal level of the comparison output signal $FD_{out}$, which shows whether the frequency resulting from the fourth oscillating action is lower or higher, is stored in the fourth flip-flop FF4 of the successive approximation register (SAR) 22 as follows. That is, the signal level of the comparison output signal $FD_{out}$ is stored through the data input terminal D in response to High level "1" of the fifth clock signal cks4 supplied to the clock terminal C4 of the fourth flip-flop FF4 of FIG. 5 in keeping with the timing of Step 4 of FIG. 6. For example, the fourth flip-flop FF4 is reset by Low level "0" in case of the lower frequency, and therefore the fourth bit output data Q4 from the successive approximation register (SAR) 22 becomes Low level "0". In addition, the fourth flip-flop FF4 is set by High level "1" in case of the higher frequency, and therefore the fourth bit output data Q4 of the successive approximation register (SAR) 22 becomes High level "1". In either case, the fifth clock signal cks4 of High level "1" is also supplied to the set terminal S5 of the fifth flip-flop FF5, and therefore the fifth bit output data Q5 of the successive approximation register (SAR) 22 becomes High level "1".

Step 4 of FIG. 3 shows bit patterns of the fourth bit output data Q4 of the successive approximation register 22 using the comparison output signal $FD_{out}$ resulting from the third oscillating action utilizing one of the eight control codes from the successive approximation register 22 at Step 3, which reflect whether the frequency is lower or higher. The fourth bit output data Q4 of Low level "0" shows the fact that the frequency is lower. The control code of the successive approximation register 22 is changed to one of the eight control codes on the left, and the fifth oscillating action of the digital control oscillator of FLL of Step 5 is started. The fourth bit output data Q4 of High level "1" shows the fact that the frequency is higher. Then, the control code of the successive approximation register 22 is changed to one of the eight control codes on the right, and the fifth oscillating action of the digital control oscillator of FLL of Step 5 is started.

In case that in FLL shown in FIG. 1, the digital control oscillator 10 starts the fifth oscillating action at Step 5 of FIG. 6, the signal level of the comparison output signal $FD_{out}$, which shows whether the frequency resulting from the fifth oscillating action is lower or higher, is stored in the fifth flip-flop FF5 of the successive approximation register (SAR) 22 as follows. That is, the signal level of the comparison output signal $FD_{out}$ is stored through the data input terminal D in response to High level "1" of the sixth clock signal cks5 supplied to the clock terminal C5 of the fifth flip-flop FF5 of FIG. 5 in keeping with the timing of Step 5 of FIG. 6. For example, the fifth flip-flop FF5 is reset by Low level "0" in case of the lower frequency, and therefore the fifth bit output data Q5 from the successive approximation register (SAR) 22 becomes Low level "0". In addition, the fifth flip-flop FF5 is set by High level "1" in case of the higher frequency, and therefore the fifth bit output data Q5 of the successive approximation register (SAR) 22 becomes High level "1".

Step 5 of FIG. 3 shows all bits of output data Q1-Q5 including bit patterns of the fifth bit output data Q5 of the successive approximation register 22 using the comparison output signal $FD_{out}$ resulting from the fourth oscillating action utilizing one of the sixteen control codes from the successive approximation register 22 at Step 4, which reflect whether the frequency is lower or higher. The fifth bit output data Q5 of Low level "0" shows the fact that the frequency is lower. In this case, the 16 decimal values on the left of the successive approximation register 22 are changed to one of an even number of final control codes, the set delay stage umber N of the digital control oscillator 10 of FLL is set finally, and then a formal oscillating action is started. The fifth bit output data Q5 of High level "1" shows the fact that the frequency is higher. In this case, the 16 decimal values on the right of the successive approximation register 22 are changed to one of an odd number of final control codes, the set delay stage umber N of the digital control oscillator 10 of FLL is set finally, and then a formal oscillating action is started.

In the way as described above, in FLL examined by the inventors prior to the invention and shown in FIG. 1, the value of the multiplication number M is decided in case that the reference frequency $f_{REF}$ and unit delay amount td have already known, and then the set delay stage umber N of the digital control oscillator 10 in the successive approximation register (SAR) 22 is decided.

FIG. 4 is a diagram showing the relation between the variable multiplication number M of the program counter 32 serving as a variable multiplier, and the set delay stage umber N of the digital control oscillator 10 in regard to FLL shown in FIG. 1.

As is clear from Expression 4, in case that the reference frequency $f_{REF}$ and unit delay amount td are constant, the variable multiplication number M and set delay stage umber N are in inverse proportion to each other. In other words, the set delay stage umber N is increased when the variable multiplication number M is decreased, and the set delay stage umber N is decreased when the variable multiplication number M is increased. The reference frequency $f_{REF}$ which is stable regardless of the change in temperature and the fluctuation of the source voltage can be achieved by using a quartz oscillator for a reference frequency oscillator circuit. However, the unit delay amount td of the digital control variable delay circuit 12 of FLL of FIG. 1 has a relatively large temperature dependence. In FIG. 4, the characteristic curve Ltp shows the relation between the variable multiplication number M and set delay stage umber N of FLL when a semiconductor chip of the semiconductor integrated circuit equipped with FLL is placed at a nearly room temperature. Also, in FIG. 4, the characteristic curve Lmax shows the relation between the variable multiplication number M and set delay stage umber N of FLL under a situation such that the semiconductor chip of the semiconductor integrated circuit equipped with FLL is placed at a lower temperature, and the unit delay amount td is decreased. Further, in FIG. 4 the characteristic curve Lmini shows the relation between the variable multiplication number M and set delay stage umber N of FLL under a situation such that the semiconductor chip of the semiconductor integrated circuit equipped with FLL is placed at a higher temperature and the unit delay amount td is increased.

As stated above, the unit delay amount td of the digital control variable delay circuit 12 of FLL of FIG. 1 has a relatively large temperature dependence. Therefore, the set delay stage umber N of the digital control oscillator 10 is set in the successive approximation register (SAR) 22 so as to fit the decided value of the multiplication number M and the unit delay amount td depending on the temperature of the chip.

However, as is clear from FIG. 6, the number of steps in proportion to the bit number of the successive approximation register (SAR) 22 is required to set the set delay stage umber N of the digital control oscillator 10 in the successive approximation register (SAR) 22 finally. In the example of FIG. 6, the successive approximation register (SAR) 22 has a structure as small as five bits. Therefore, the final set delay stage umber N can be set even with a step number of five.

Also, it has been found that the actual bit number of the successive approximation register (SAR) 22 is 12, and the number of steps to set the final set delay stage umber N is a large value of 12 because the maximum number 2047 is set as the variable multiplication number M for the program counter 32 as s¥described above.

In addition, it has been found that FLL including a successive approximation register (SAR) of two bits or larger, has a problem that the lock time (settling time) of FLL is longer because the lock operation of FLL is started after setting a final set delay stage umber on the successive approximation register (SAR) according to two or more steps fitting the decided multiplication number. Further, there has been a problem that the time for recovering the operation from the sleep state in which an FLL-generated clock is stopped to the active state in which supply of the FLL-generated clock is resumed is made longer in case that the lock time of FLL is longer.

The present invention was made by the inventors as a result of the examination prior to the invention as described above.

Therefore, it is an object of the invention to reduce the number of steps for storing two or larger bits of digital control information in a register for digitally controlling a clock signal generating part. Also, it is another object of the invention to reduce the lock time of FLL, PLL or DLL, which includes a successive approximation register (SAR) to store two or larger bits of digital control information in.

The above and other objects of the invention and novel features thereof will be apparent from the description hereof and the accompanying drawings.

Of the embodiments disclosed herein, preferred ones will be briefly described below.

A semiconductor integrated circuit according to a preferred embodiment of the invention includes a clock generating section having a digital control clock signal generating part (10) operable to generate a clock signal (CLKm), and a digital control part (20) operable to control the digital control clock signal generating part (10). The clock generating section (10, 20, 30) further has a comparator (31) and a control register (22).

In the semiconductor integrated circuit, the comparator (31) is supplied with a reference signal ($CLK_{in}$) and the comparator (31) is supplied with a feedback signal (Mout) generated from the clock signal (CLKm) through a feedback path (32). The control register (22) is supplied with an output signal ($FD_{out}$) of the comparator (31), and the control register (22) stores two or larger bits of digital control information.

When the control register stores digital control information of a predetermined value, the feedback signal is locked to the reference signal. The clock generating section works in two or more operation conditions.

The clock generating section further includes a control data storing circuit (25) connected with the control register (22). In the control data storing circuit (25), sets of initial set data for operations in the two or more operation conditions are stored in advance.

Operation select information (Min) for selecting the one operation condition is supplied to the control data storing circuit (25) prior to an operation by the clock generating section in the one operation condition. In response to the operation select information (Min), initial set data (Set1-Set5) for the operation in the one operation condition is stored at an upper bit of the control register (22) from the control data storing circuit (25) (see FIG. 7).

Now, an effect achieved by the preferred ones of embodiments herein disclosed is briefly as follows. That is, according to the invention, the number of steps to store two or large bits of digital control information in a register for digitally controlling a clock signal generating part can be reduced.

DETAILED DESCRIPTION OF THE PREFERRED EMBODIMENTS

1. Summary of the Preferred Embodiments

Figure 1:
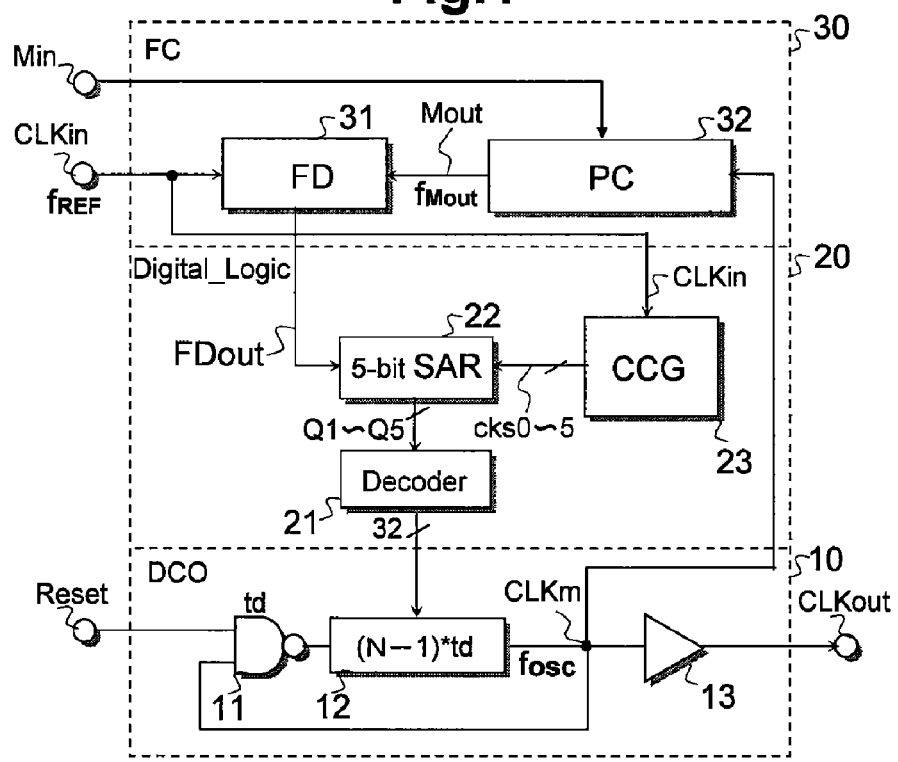
FIG. 1 is a diagram showing a configuration of FLL examined by the inventors prior to the invention.
Figure 2:
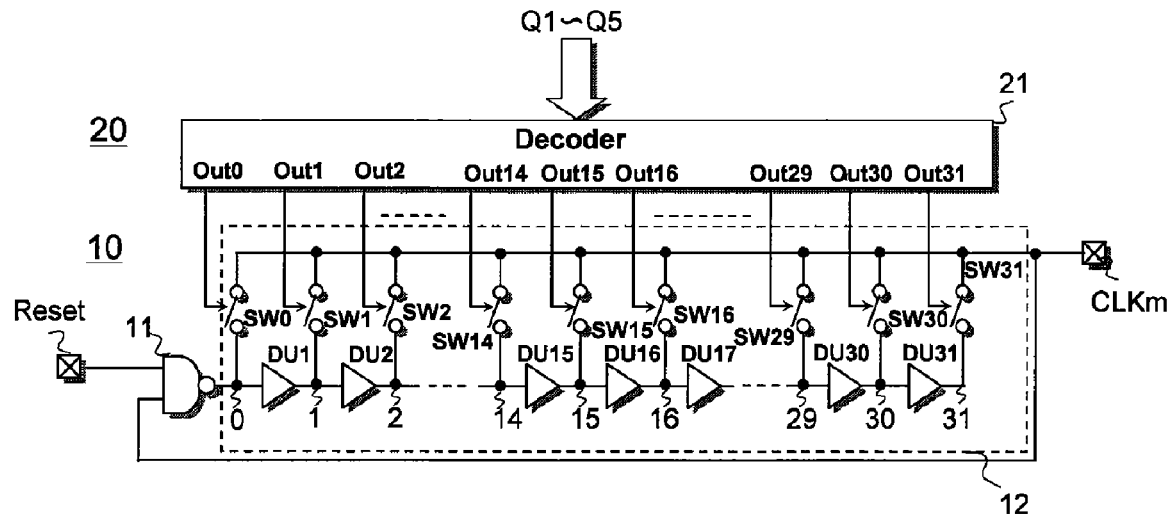
FIG. 2 is a diagram showing a configuration of the digital control variable delay circuit of the digital control oscillator of FLL shown in FIG. 1.

The preferred embodiments of the invention herein disclosed will be outlined, first. The reference numerals, characters and signs for reference to the drawings, which are accompanied with paired round brackets here, only exemplify what the concepts of parts or components referred to by the numerals, characters and signs contain.

[1] A semiconductor integrated circuit according to a preferred embodiment of the invention includes a clock generating section having a digital control oscillator (10) operable to generate an oscillation clock signal (CLKm) and a digital control part (20) operable to control at least one of the phase and frequency of the oscillation clock signal generated by the digital control oscillator.

The clock generating section (10, 20, 30) includes a comparator (31), a counter (32) and a control register (22).

When the oscillation clock signal (CLKm) generated by the digital control oscillator (10) is supplied to an input terminal of the counter (32), an output signal (Mout) arises from an output terminal of the counter (32). A reference signal ($CLK_{in}$) is supplied to one input terminal of the comparator (31), and the output signal (Mout) arising from the output terminal of the counter (32) is supplied to the other input terminal of the comparator (31).

When the control register (22) is supplied with an output signal ($FD_{out}$) of the comparator (31), the control register (22) stores two or larger bits of digital control information (Q1-Q5) for controlling the digital control oscillator (10).

The comparator (31), control register (22), digital control oscillator (10) and counter (32) constitute a locked loop (LL) making at least one of a Phase Locked Loop (PLL) and Frequency Locked Loop (FLL).

When the control register (22) stores digital control information having a predetermined value, at least one of the phase and frequency of the output signal (Mout) at the other input terminal of the comparator (31) is locked to at least one of the phase and frequency of the reference signal ($CLK_{in}$) at the one input terminal of the comparator (31).

The locked loop (LL) can work in two or more operation conditions by setting two or more frequencies for the reference signal ($CLK_{in}$) or setting two or more multiplication ratios for the counter (32).

The locked loop (LL) works in one operation condition selected from among the two or more operation conditions by setting one frequency selected from among the two or more frequencies for the reference signal ($CLK_{in}$), or setting one multiplication ratio selected among the two or more multiplication ratios for the counter (32).

The clock generating section further includes a control data storing circuit (25) connected with the control register (22). In the control data storing circuit (25), sets of initial set data for operation by the locked loop (LL) in the two or more operation conditions can be stored in advance.

Operation select information (Min) for selecting the one operation condition is supplied to the control data storing circuit (25) prior to an operation by the locked loop (LL) in the one operation condition.

In response to the operation select information (Min), initial set data (Set1-Set5) for the operation in the one operation condition is stored at an upper bit of the control register (22) from the control data storing circuit (25) (see FIGS. 7, 8 and 9-12).

According to the embodiment, initial set data (Set1-Set5) corresponding to the selected one operation condition is stored at an upper bit of the control register (22) in case that the locked loop (LL) works in one operation condition selected from among the two or more operation conditions. Therefore, the need for using all the steps according to a binary search algorithm, etc. to decide two or larger bits of digital control information (Q1-Q5) of the control register (22) is eliminated. As a result, the steps to store two or large bits of digital control information in the control register (22) in which two or larger bits of digital control information (Q1-Q5) for controlling the digital control oscillator (10) of the locked loop (LL) are stored can be reduced.

According to a preferable embodiment, the output signal ($FD_{out}$) of the comparator (31) is supplied to lower bits other than the upper bit of the control register (22) during the operation in the one operation condition.

According to the preferable embodiment, even in case that the digital control oscillator (10) of the locked loop (LL) has large variations in its properties, and source voltage dependence and temperature dependence, digital control information which enables compensation of fluctuations owing to these factors is stored at the lower bits of the control register (22). As a result, the locked loop (LL) can execute an accurate lock operation in case that it is set to be in any of the two or more operation conditions According to a more preferable embodiment, the clock generating section further includes a control clock generating circuit (23) operable to generate multi-clock control signals (cks0-cks5) mutually differing in phase in response to the reference signal ($CLK_{in}$) (see FIG. 5).

The control data storing circuit (25) responds to the operation select information (Min) to generate select signals (Sel1, Sel2, Sel3) indicating an upper bit of the control register (22) in which the initial set data (Set1-Set5) is to be stored.

The initial set data is stored at the upper bit of the control register (22) specified by the select signals (Sel1, Sel2, Sel3) in keeping with the timing of the first clock control signal (cks0) of the multi-clock control signals generated by the control clock generating circuit (23).

The output signal ($FD_{out}$) of the comparator (31) is supplied to the lower bits of the control register (22) in keeping with the timings of the clock control signals (cks1, cks2, . . . ) subsequent to the first clock control signal (cks0) of the multi-clock control signals generated by the control clock generating circuit (23).

According to a still more preferable embodiment, the counter (32) is arranged as a variable counter which can work with an appropriate multiplication ratio selected from among the two or more multiplication ratios.

The operation select information (Min) is for selecting the appropriate multiplication ratio of the counter (32) arranged as the variable counter.

Figure 7:
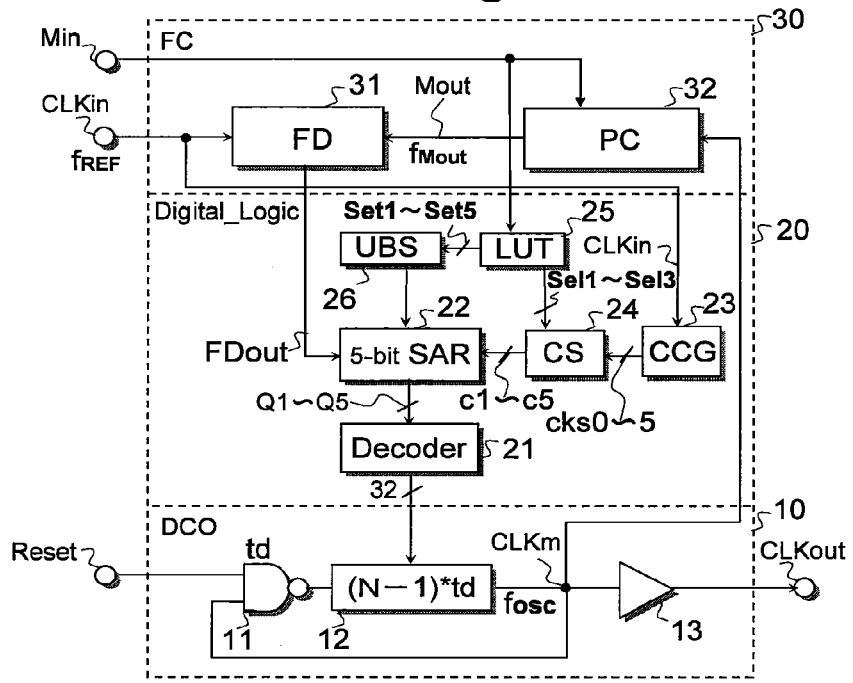
FIG. 7 is a diagram showing a basic configuration of FLL according to an embodiment of the invention.

According to a specific embodiment, the digital control oscillator (10) includes a delay ring oscillating part (11, 12) including a digital control variable delay circuit (12) which can be controlled in the delay stage number (N) according to the two or larger bits of digital control information (Q1-Q5) of the control register (22) (see FIG. 7).

According to another specific embodiment, the digital control oscillator (10) has an LC-tank including two or more quantized capacitances controlled according to the two or larger bits of digital control information (Q1-Q5) of the control register (22).

Figure 16:
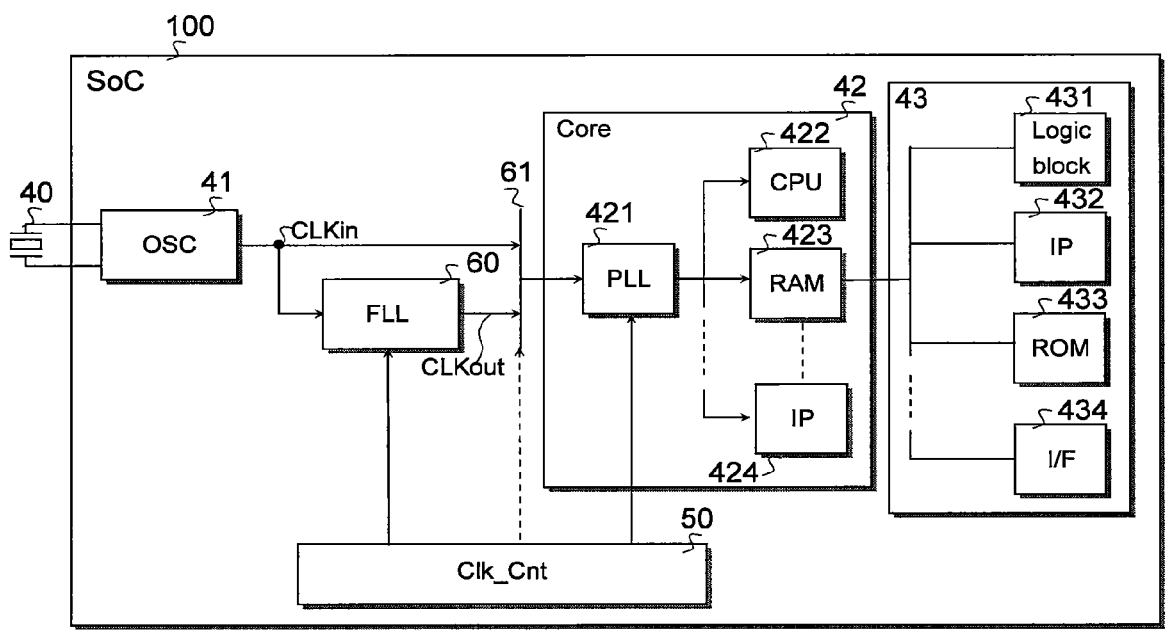
FIG. 16 is a diagram showing a configuration of SOC (System On Chip) which incorporates one of the FLL as shown in FIG. 7, PLL as shown in FIG. 17 and DLL as shown as shown in FIG. 15 as a clock-supplying circuit for supplying an operation clock signal to an internal circuit of LSI.

According to a most specific embodiment, an output clock signal ($CLK_{out}$) generated from the oscillation clock signal (CLKm) of the digital control oscillator (10) of the locked loop (LL) is supplied to an internal circuit (42, 43) of the semiconductor chip (100) as an operation clock (see FIG. 16).

[2] A semiconductor integrated circuit according to a preferred embodiment in terms of another aspect of the invention includes a clock generating section having a digital control delay unit (10) operable to generate a delay clock signal (CLKm) by delaying a reference signal ($CLK_{in}$) and a digital control part (20) operable to control at least one of the phase and frequency of the delay clock signal generated by the digital control delay unit.

The clock generating section (10, 20, 30) includes a comparator (33), a control register (22) and an output buffer (13).

When the delay clock signal (CLKm) generated by the digital control delay unit (10) is supplied to an input terminal of the output buffer (13), an output clock signal ($CLK_{out}$) arises from an output terminal of the output buffer (13). The reference signal ($CLK_{in}$) is supplied to one input terminal of the comparator (33), and the output clock signal ($CLK_{out}$) arising from the output buffer (13) is supplied to the other input terminal of the comparator (33).

When the control register (22) is supplied with an output signal ($FD_{out}$) of the comparator (33), the control register (22) stores two or larger bits of digital control information (Q1-Q5) for controlling the digital control delay unit (10).

The comparator (33), control register (22) and digital control delay unit (10) constitute a delay locked loop (DLL).

When the control register (22) stores digital control information having a predetermined value, at least one of the phase and frequency of the output clock signal ($CLK_{out}$) at the other input terminal of the comparator (33) is locked to at least one of the phase and frequency of the reference signal ($CLK_{in}$) at the one input terminal of the comparator (33).

The delay locked loop (DLL) can work in two or more operation conditions by setting two or more frequencies for the reference signal ($CLK_{in}$) or setting two or more delay amounts for the output buffer (13). The delay locked loop (DLL) works in one operation condition selected from among the two or more operation conditions by setting one frequency selected from among the two or more frequencies for the reference signal ($CLK_{in}$) or setting one delay amount selected from among the two or more delay amounts for the output buffer (13).

The clock generating section further includes a control data storing circuit (25) connected with the control register (22). In the control data storing circuit (25), sets of initial set data for operation by the delay locked loop (DLL) in the two or more operation conditions can be stored in advance.

Operation select information (Lin) for selecting the one operation condition is supplied to the control data storing circuit (25) prior to an operation by the delay locked loop (DLL) in the one operation condition. In response to the operation select information (Lin), initial set data (Set1-Set5) for the operation in the one operation condition is stored at an upper bit of the control register (22) from the control data storing circuit (25) (see FIG. 15).

According to the embodiment, initial set data (Set1-Set5) corresponding to the selected one operation condition is stored at an upper bit of the control register (22) in case that DLL works in one operation condition selected from among the two or more operation conditions. Therefore, the need for using all the steps according to a binary search algorithm, etc. to decide two or larger bits of digital control information (Q1-Q5) of the control register (22) is eliminated. As a result, the steps to store two or large bits of digital control information in the control register (22) in which two or larger bits of digital control information (Q1-Q5) for controlling the digital control delay unit (10) of DLL are stored can be reduced.

According to a preferable embodiment, the output signal (FD$_{out}$) of the comparator (33) is supplied to lower bits other than the upper bit of the control register (22) during the operation in the one operation condition.

According to the preferable embodiment, even in case that the digital control delay unit (10) of DLL has large variations in its properties, and source voltage dependence and temperature dependence, digital control information which enables compensation of fluctuations owing to these factors is stored at the lower bits of the control register (22). As a result, DLL can execute an accurate lock operation in case that it is set to be in any of the two or more operation conditions.

Figure 15:
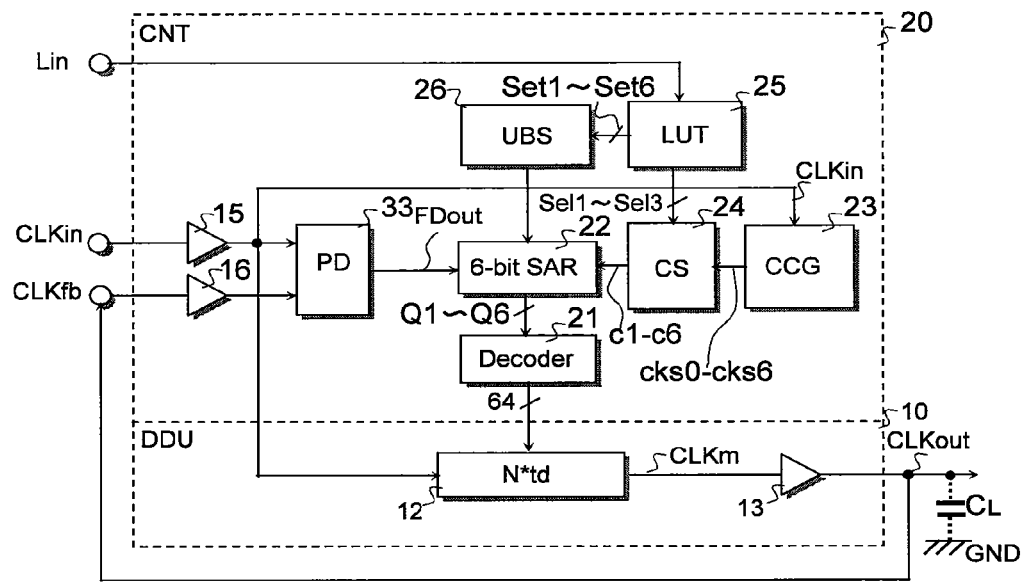
FIG. 15 is a diagram showing a basic configuration of DLL according to another embodiment of the invention.

According to a more preferable embodiment, the clock generating section further includes a control clock generating circuit (23) operable to generate multi-clock control signals (cks0-cks5) mutually differing in phase in response to the reference signal (CLK$_{in}$) (see FIG. 15).

The control data storing circuit (25) responds to the operation select information (Lin) to generate select signals (Sel1, Sel2, Sel3) indicating an upper bit of the control register (22) in which the initial set data (Set1-Set5) is to be stored.

The initial set data is stored at the upper bit of the control register (22) specified by the select signals (Sel1, Sel2, Sel3) in keeping with the timing of the first clock control signal (cks0) of the multi-clock control signals generated by the control clock generating circuit (23).

The output signal (FD$_{out}$) of the comparator (33) is supplied to the lower bits of the control register (22) in keeping with the timings of the clock control signals (cks1, cks2, . . . ) subsequent to the first clock control signal (cks0) of the multi-clock control signals generated by the control clock generating circuit (23).

According to a still more preferable embodiment, the output buffer (13) is arranged as a variable delay module which can work providing an appropriate delay amount selected from among the two or more delay amounts.

The operation select information (Lin) is for selecting the appropriate delay amount of the output buffer (13) arranged as a variable delay module.

According to a specific embodiment, the digital control delay unit (10) includes a digital control variable delay circuit (12) which can be controlled in the delay stage number (N) by the two or larger bits of digital control information (Q1-Q5) of the control register (22) (see FIG. 15).

According to a most specific embodiment, the output clock signal (CLK$_{out}$) arising from the output buffer (13) of the delay locked loop (DLL) is supplied to an internal circuit (42, 43) of the semiconductor chip (100) as an operational clock (see FIG. 16).

[3] A semiconductor integrated circuit according to a preferred embodiment in terms of still another aspect of the invention includes a clock generating section having a digital control clock signal generating part (10) operable to generate a clock signal (CLKm) and a digital control part (20) operable to control at least one of the phase and frequency of the clock signal generated by the digital control clock signal generating part.

The clock generating section (10, 20, 30) includes a phase-frequency comparator (31) serving as a time-to-digital converter (TDC) operable to convert the phase difference between two input signals into a digital signal, and a control register (22).

A reference signal (CLK$_{in}$) is supplied to one input terminal of the comparator (31). To the other input terminal of the comparator (31), a feedback signal (Mout, CLK$_{out}$) generated from the clock signal (CLKm) is supplied through a feedback path (32, 13).

When the control register (22) is supplied with an output signal (FD$_{out}$) of the comparator (31), the control register (22) stores two or larger bits of digital control information (Q1-Q5) for controlling the digital control clock signal generating part (10).

The phase-frequency comparator (31), control register (22), digital control clock signal generating part (10) and feedback path (32, 13) constitute a digital control Phase Locked Loop (PLL).

When the control register stores digital control information having a predetermined value, at least one of the phase and frequency of the feedback signal supplied to the other input terminal of the comparator is locked to at least one of the phase and frequency of the reference signal supplied to the one input terminal of the comparator.

The clock generating section (10, 20, 30) can work in two or more operation conditions by setting two or more frequencies for the reference signal (CLK$_{in}$) or setting two or more control amounts for the feedback path (32, 13).

The clock generating section works in one operation condition selected from among the two or more operation conditions by setting one frequency selected from among the two or more frequencies for the reference signal (CLK$_{in}$), or setting one control amount selected among the two or more control amounts for the feedback path.

The clock generating section further includes a control data storing circuit (25) connected with the control register (22). In the control data storing circuit (25), sets of initial set data for operation by the clock generating section in the two or more operation conditions can be stored in advance.

Operation select information (Min) for selecting the one operation condition is supplied to the control data storing circuit (25) prior to an operation by the clock generating section in the one operation condition. In response to the operation select information (Min), initial set data (Set1-Set5) for the operation in the one operation condition is stored at an upper bit of the control register (22) from the control data storing circuit (25) (see FIG. 17).

According to the embodiment, initial set data (Set1-Set5) corresponding to the selected one operation condition is stored at an upper bit of the control register (22) in case that the clock generating section works in one operation condition selected from among the two or more operation conditions. Therefore, the need for using all the steps according to a binary search algorithm, etc. to decide two or larger bits of digital control information (Q1-Q5) of the control register (22) is eliminated. As a result, the steps to store two or large bits of digital control information in the control register (22) in which two or larger bits of digital control information (Q1-Q5) for controlling the digital control clock signal generating part (10) of the clock generating section are stored can be reduced.

According to a preferable embodiment, the output signal (FD$_{out}$) of the comparator (31) is supplied to lower bits other than the upper bit of the control register (22) during the operation in the one operation condition.

According to the preferable embodiment, even in case that the digital control clock signal generating part (10) of the clock generating section has large variations in its properties, and source voltage dependence and temperature dependence, digital control information which enables compensation of fluctuations owing to these factors is stored at the lower bits of the control register (22). As a result, PLL can execute an accurate lock operation in case that it is set to be in any of the two or more operation conditions.

Figure 17:
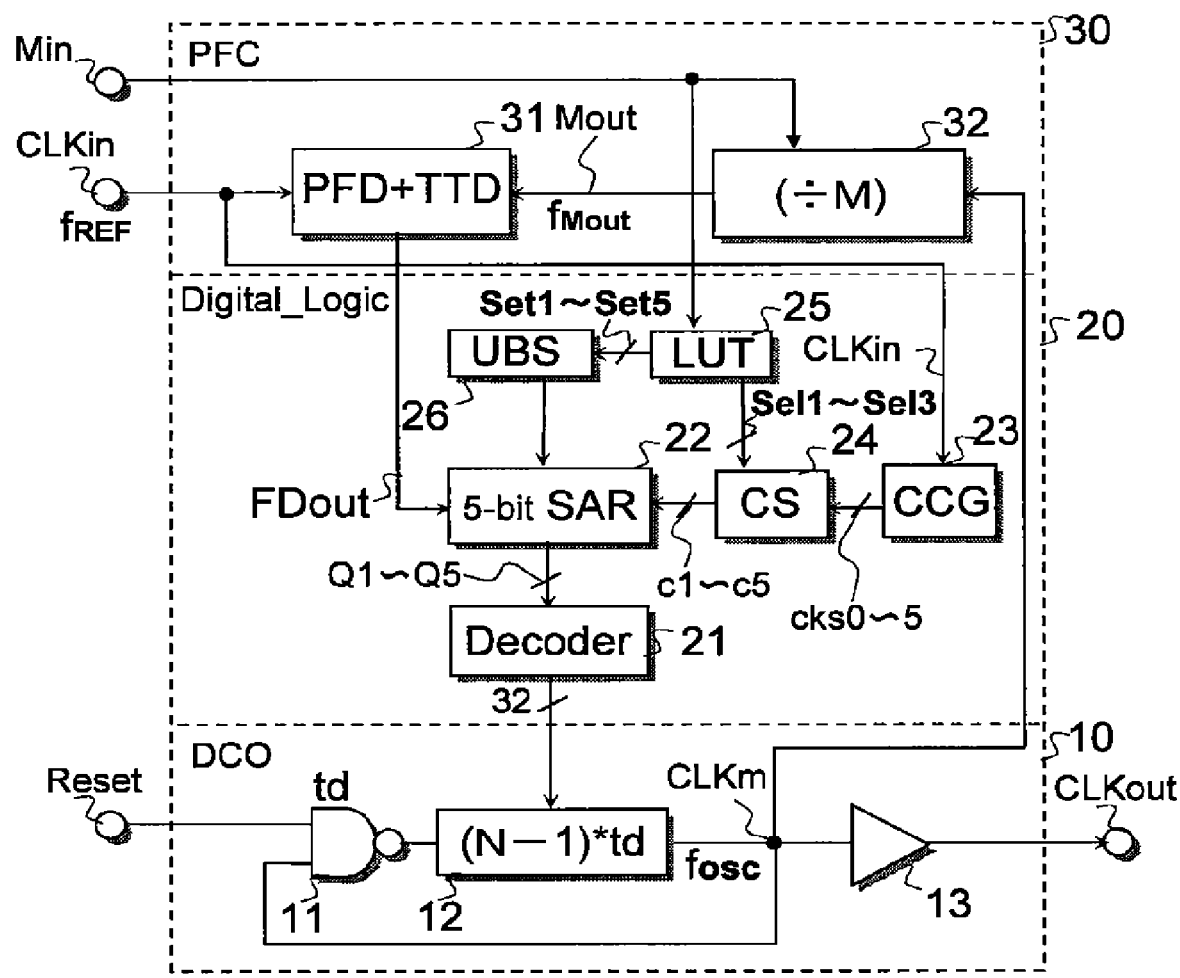
FIG. 17 is a diagram showing a basic configuration of PLL according to another embodiment of the invention.

According to a more preferable embodiment, the clock generating section further includes a control clock generating circuit (23) operable to generate multi-clock control signals (cks0-cks5) mutually differing in phase in response to the reference signal ($CLK_{in}$) (see FIG. 17).

The control data storing circuit (25) responds to the operation select information (Min) to generate select signals (Sel1, Sel2, Sel3) indicating an upper bit of the control register (22) in which the initial set data (Set1-Set5) is to be stored.

The initial set data is stored at the upper bit of the control register (22) specified by the select signals (Sel1, Sel2, Sel3) in keeping with the timing of the first clock control signal (cks0) of the multi-clock control signals generated by the control clock generating circuit (23).

The output signal ($FD_{out}$) of the comparator (31) is supplied to the lower bits of the control register (22) in keeping with the timings of the clock control signals (cks1, cks2, . . . ) subsequent to the first clock control signal (cks0) of the multi-clock control signals generated by the control clock generating circuit (23).

According to a specific embodiment, the digital control clock signal generating part (10) includes a digital control variable delay circuit (12) which can be controlled in the delay stage number (N) by the two or larger bits of digital control information (Q1-Q5) of the control register (22) (see FIG. 17).

According to a more specific embodiment, the digital control oscillator (10) has an LC-tank including two or more quantized capacitances controlled according to the two or larger bits of digital control information (Q1-Q5) of the control register (22).

According to another specific embodiment, the digital control clock signal generating part (10) has a delay ring including two or more delay cells. Between the control register (22) and delay ring, a D/A converter is connected. The D/A converter is a D/A converter of current output type such that operation current of the two or more delay cells of the delay ring is output in response to the two or larger bits of digital control information (Q1-Q5) of the control register (22).

According to the most specific embodiment, the output clock signal ($CLK_{out}$) generated by the clock generating section is supplied to an internal circuit (42, 43) of a semiconductor chip (100) as an operation clock (see FIG. 16).

2. Further Detailed Description of the Preferred Embodiments

The embodiments will be described further in detail. In all the drawings to which reference is made in describing the best mode of carrying out the invention, a functionally like part or component with a part or component already described above with reference to the drawings is identified by the same reference numeral, character or sign, and repetition of its description is omitted.

<<Basic Configuration of FLL >>

FIG. 7 is a diagram showing a basic configuration of FLL according to an embodiment of the invention.

Also, FLL of FIG. 7 includes, as in FLL of FIG. 1, a frequency comparison part 30, a digital control part 20 serving as a digital logic and a digital control oscillator (DCO) 10 in the form of a circuit of a delay ring oscillating part.

The digital control oscillator 10 includes a two-input NAND gate 11 with one input terminal supplied with a reset signal Reset, a digital control variable delay circuit 12 including N−1 delay cells having a unit delay amount td, and an output buffer 13.

The digital control part 20 includes a decoder 21, a successive approximation register (SAR) 22, and a control clock generating circuit (CCG) 23. The number of bits of the successive approximation register 22 (SAR) is 12 actually. Therefore, the variable multiplication number M of the program counter (PC) 32 of an 11-bit structure of the frequency comparison part 30 can be set to up to the maximum 2047. For the sake of simplicity, the bit number of the successive approximation register (SAR) 22 shall be five here.

The frequency comparison part 30 includes a frequency comparator (FD) 31 and a program counter (PC) 32 serving as a variable multiplier.

In comparison to FLL of FIG. 1, the digital control part 20 of FLL of FIG. 7 has additionally a clock select circuit (CS) 24, a control data storing circuit (LUT) 25 and an upper-bit setting circuit (UBS) 26.

The multiplication number M supplied to the program counter (PC) 32 through the input terminal Min for setting a multiplication number is also supplied to the control data storing circuit (LUT) 25. In response to the multiplication number M thus supplied, the control data storing circuit (LUT) 25 outputs an upper bit of the set delay stage umber N corresponding to the supplied division number M, which are set as initial data on an upper bit of the flip-flop of the successive approximation register (SAR) 22. The upper bit can be set as follows.

As described with reference to Expression 4 and FIG. 4, the variable multiplication number M of the program counter 32 and the set delay stage umber N of the digital control oscillator 10 are in inverse proportion to each other. Specifically, the set delay stage umber N is increased when the variable multiplication number M is decreased, and the set delay stage umber N is decreased when the variable multiplication number M is increased.

Figure 4:
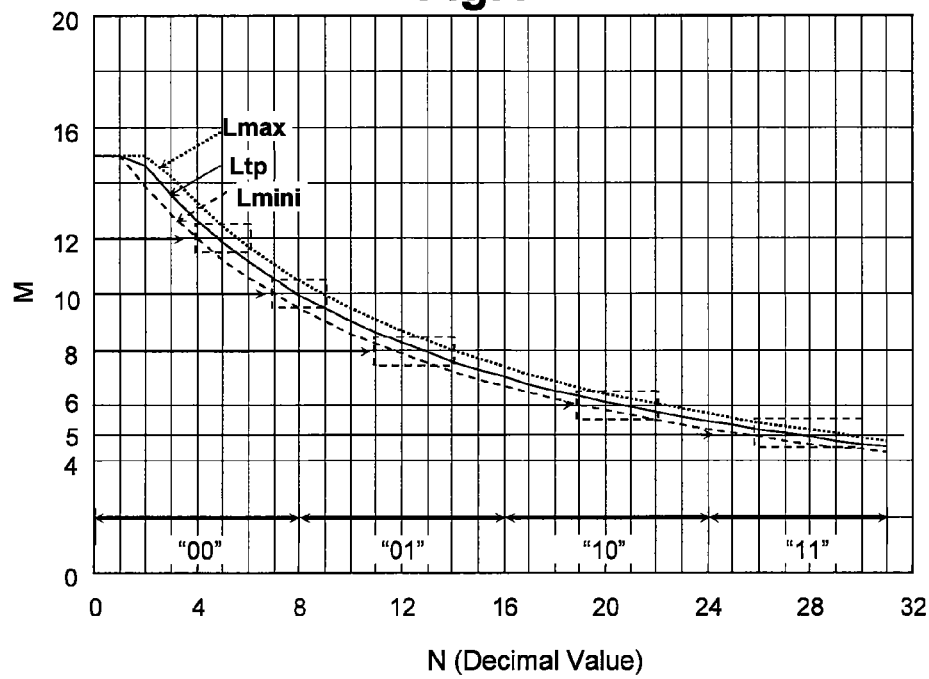
FIG. 4 is a diagram showing the relation between the variable multiplication number of the program counter serving as a variable multiplier, and the set delay stage umber of the digital control oscillator in regard to FLL shown in FIG. 1.

Also, as is clear from FIG. 4, in a region that the variable multiplication number M is large, the fluctuation of the set delay stage umber N owing to the fluctuation of the unit delay amount td is relatively smaller, whereas in a region that the variable multiplication number M is small, the fluctuation of the set delay stage umber N owing to the fluctuation of the unit delay amount td is relatively larger.

In other words, the set delay stage umber N, which is prepared by the control data storing circuit (LUT) 25 from a small value of the variable multiplication number M according to the relation of inverse proportion, is relatively lower in accuracy. Hence, the upper bit of the set delay stage umber N with respect to a small value of variable multiplication number M is set according to the relatively lower accuracy. In the example of FIG. 4, upper two bits of five bits set on the successive approximation register (SAR) 22 corresponding to the set delay stage umber N of the digital control oscillator 10 is output from the control data storing circuit (LUT) 25, and set as initial data on an upper bit of the flip-flop of the successive approximation register (SAR) 22.

Specifically, in the example of FIG. 4, as to a region that the variable multiplication number M takes a large value ranging from 15 to 10, the control data storing circuit (LUT) 25 produces initial set data "00" in response to a large multiplication number, which are set as initial data on the flip-flops of upper bits of the successive approximation register (SAR) 22. With a region that the variable multiplication number M takes a relatively large value ranging from 10 to 7, the control data storing circuit (LUT) 25 produces initial set data "01" in response to a relatively large multiplication number, which are set as initial data on the flip-flops of the upper bits of the successive approximation register (SAR) 22. Further, as for a region that the variable multiplication number M takes a relatively small value ranging from 7 to 5.5, the control data storing circuit (LUT) 25 produces initial set data "10" in response to a relatively small multiplication number, which are set as initial data on the flip-flops of the upper bits of the successive approximation register (SAR) 22. In regard to a region that the variable multiplication number M takes a small value of 5.5 or below, the control data storing circuit (LUT) 25 produces initial set data "11" in response to a small multiplication number, which are set as initial data on the flip-flops of the upper bits of the successive approximation register (SAR) 22.

In FLL of FIG. 7, the control data storing circuit (LUT) 25 produces initial setting control signals Set1, Set2, Set3, Set4 and Set5 used in initial setting on the successive approximation register 22 in response to the multiplication number M supplied thereto, and supplies the signals to the upper-bit setting circuit (UBS) 26, whereby initial setting of the successive approximation register (SAR) 22 is carried out. Further, in FLL of FIG. 7, the number of upper bits of the successive approximation register (SAR) 22 targeted for initial setting is specified by select signals Sel1, Sel2 and Sel3 produced by the control data storing circuit (LUT) 25 in response to the supplied multiplication number M and supplied to the clock select circuit (CS) 24. Specifically, in case that the select signals Sel1, Sel2 and Sel3 constitute data "111", initial setting is executed on the upper three bits of flip-flops of the successive approximation register (SAR) 22. In case that the select signals Sel1-Sel3 form data "110", initial setting is executed on the upper two bits of flip-flops of the successive approximation register (SAR) 22. Further, in case that the select signals Sel1-Sel3 make data "100", initial setting is carried out on upper one bit of the flip-flop of the successive approximation register (SAR) 22.

After initial setting on the successive approximation register 22, the select signals Sel1-Sel3 are also used for selection in case that the signal level of comparison output signal $FD_{out}$ of the phase-frequency comparator 31 is set on a lower bit of the flip-flop of the successive approximation register 22 in keeping with the timings of multi-clock signals cks0-cks5 from the control clock generating circuit 23.

<<Initial Setting of the Set Delay Stage Umber on an Upper Bit of the Successive Approximation Register>>

Under the control of the upper-bit setting circuit 26, which is supplied with initial setting control signals Set1-Set5 produced by the control data storing circuit 25 in response to the multiplication number M supplied to the input terminal Min for setting a multiplication number, an upper bit of the set delay stage umber N can be set as initial data on an upper bit of the flip-flop of the successive approximation register 22.

Figure 8:
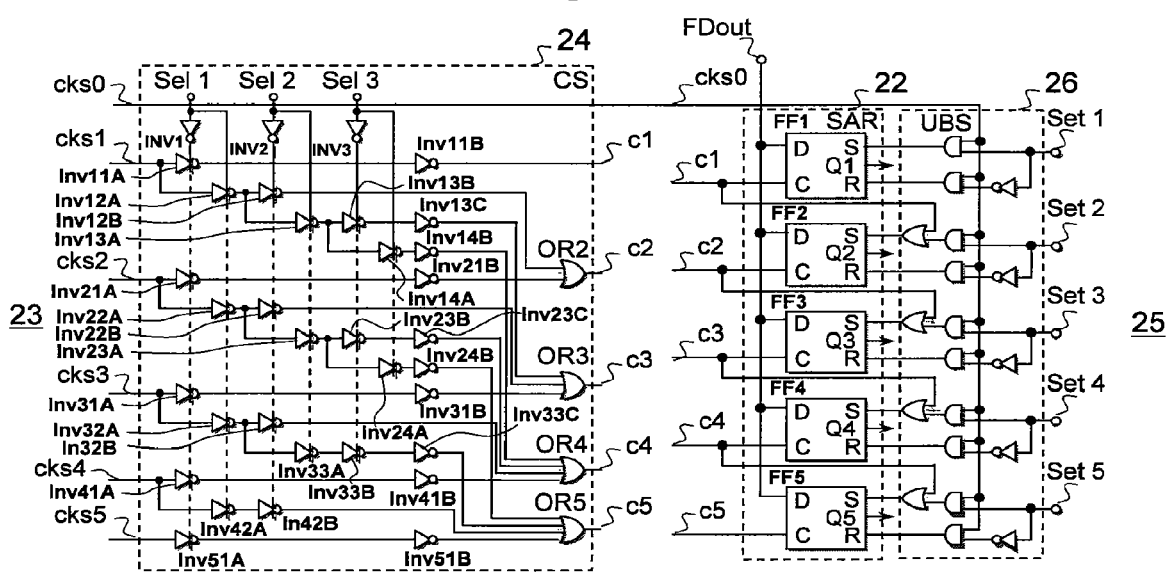
FIG. 8 is a diagram showing an arrangement of the successive approximation register, upper-bit setting circuit and clock select circuit of the digital control part of FLL according to an embodiment of the invention shown in FIG. 7.

FIG. 8 is a diagram showing an arrangement of the successive approximation register (SAR) 22, upper-bit setting circuit (UBS) 26 and clock select circuit (CS) 24 of the digital control part 20 of FLL according to an embodiment of the invention shown in FIG. 7.

As shown in a right portion of the drawing (in FIG. 8), the successive approximation register (SAR) 22 includes five flip-flops FF1-FF5; the comparison output signal $FD_{out}$ of the frequency comparator 31 of the frequency comparison part 30 is commonly supplied to data input terminals D of the five flip-flops. The upper-bit setting circuit (UBS) 26 includes five inverters, ten AND circuits and four OR circuits. The five inverters of the upper-bit setting circuit (UBS) 26 are supplied with initial setting control signals Set1-Set5 used for initial setting from the control data storing circuit (LUT) 25, respectively. The ten AND circuits of the upper-bit setting circuit (UBS) 26 are supplied with the first clock signal cks0 of the multi-clock signals cks0-cks5 from the control clock generating circuit 23.

In the example of FIG. 4, in a region that the variable multiplication number M takes a large value ranging from 10 to 15, the control data storing circuit 25 produces initial setting control signals Set1-Set5 in response to a large multiplication number; of the initial setting control signals, the upper two bits of signals Set1 and Set 2 make initial set data of "00". In keeping with timing of initial setting that the first clock signal cks0 is turned to High level "1", the reset terminals R of the flip-flops FF1 and FF2 for upper two bit signals in the successive approximation register (SAR) 22 are driven to High level "1" in response to initial set data "00" of the upper two bits of signals Set1 and Set2. As a result, the initial set data "00" is stored in the flip-flops FF1 and FF2 for upper two bit signals in the successive approximation register (SAR) 22. Incidentally, at this time, of the initial setting control signals Set1-Set5, the lower three bit signals Set3, Set4 and Set5 form data "000", and therefore the data "000" is stored in the flip-flops FF3, FF4 and FF5 for lower three bit signals in the successive approximation register (SAR) 22.

In the example of FIG. 4, in a region that the variable multiplication number M takes a relatively large value ranging from 7 to 10, the control data storing circuit 25 produces initial setting control signals Set1-Set5 in response to a relatively large multiplication number; of the initial setting control signals, the upper two bits of signals Set1 and Set2 make initial set data of "01". In keeping with timing of initial setting that the first clock signal cks0 is turned to High level "1", the initial set data "01" is stored in the flip-flops FF1 and FF2 for the upper two bit signals in the successive approximation register (SAR) 22 in response to the initial set data "01" of the upper two bits of signals Set1 and Set2. Also, at this time, the lower three bit signals Set3, Set4 and Set5 of the initial setting control signals Set1-Set5 form data "000", and therefore the data "000" is stored in the flip-flops FF3, FF4 and FF5 for the lower three bit signals in the successive approximation register (SAR) 22.

In the example of FIG. 4, in a region that the variable multiplication number M takes a relatively small value ranging from 5.5 to 7, the control data storing circuit 25 produces initial setting control signals Set1-Set5 in response to a relatively small multiplication number; of the initial setting control signals, the upper two bits of signals Set1 and Set2 make initial set data of "10". In keeping with timing of initial setting that the first clock signal cks0 is turned to High level "1", the initial set data "10" is stored in the flip-flops FF1 and FF2 for the upper two bit signals in the successive approximation register (SAR) 22 in response to the initial set data "10" of the upper two bits of signals Set1 and Set2. Also, at this time, the lower three bit signals Set3, Set4 and Set5 of the initial setting control signals Set1-Set5 form data "000", and therefore the data "000" is stored in the flip-flops FF3, FF4 and FF5 for the lower three bit signals in the successive approximation register (SAR) 22.

In the example of FIG. 4, in a region that the variable multiplication number M takes a small value of 5.5 or below, the control data storing circuit 25 produces initial setting control signals Set1-Set5 in response to a small multiplication number; of the initial setting control signals, the upper two bits of signals Set1 and Set2 make initial set data of "11". In keeping with timing of initial setting that the first clock signal cks0 is turned to High level "1", the set terminals S of the flip-flops FF1 and FF2 for upper two bit signals in the successive approximation register (SAR) 22 are driven to High level "1" in response to initial set data "11" of the upper two bits of signals Set1 and Set2. As a result, the initial set data "11" is stored in the flip-flops FF1 and FF2 for upper two bit signals in the successive approximation register (SAR) 22.

Incidentally, also at this time, of the initial setting control signals Set1-Set5, the lower three bit signals Set3, Set4 and Set5 form data "000", and therefore the data "000" is stored in the flip-flops FF3, FF4 and FF5 for lower three bit signals in the successive approximation register (SAR) 22.

In case that variations between LSI manufacturing processes are small and the influence of the changes in source voltage and temperature is small, initial set data can be stored in the flip-flops for upper three or more bits in the successive approximation register (SAR) 22.

Figure 5:
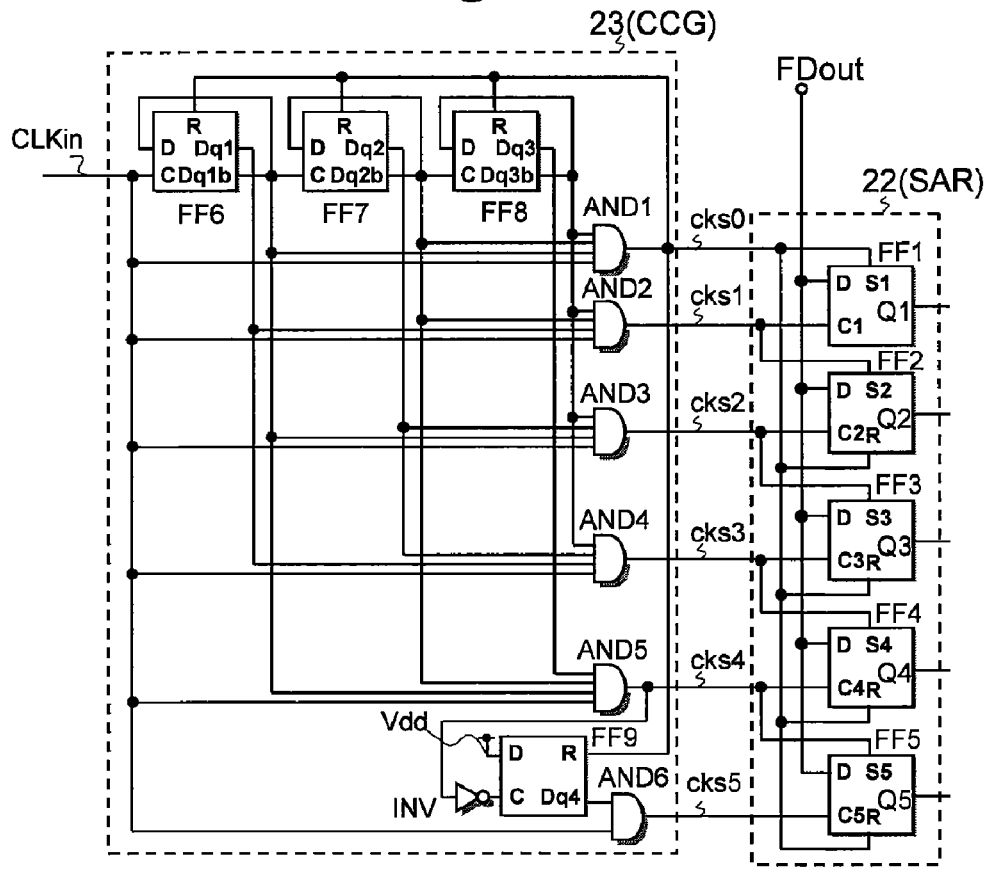
FIG. 5 is a diagram showing configurations of the successive approximation register and control clock generating circuit in the digital control part for deciding the set delay stage umber of the digital control oscillator in FLL shown in FIG. 1, which has been examined by the inventors prior to the invention.

As shown in a left portion of FIG. 8, the clock select circuit (CS) 24 of FLL of FIG. 7 is supplied with multi-clock signals cks0-cks5 from the control clock generating circuit (CCG) 23 as shown in FIG. 5, and with select signals Sel1, Sel2 and Sel3 from the control data storing circuit (LUT) 25. When the select signals Sel1, Sel2 and Sel3 are supplied to the three inverters INV1, INV2 and INV3, three inverted select signals are produced. In addition, the clock select circuit (CS) 24 shown in the left portion of FIG. 8 produces multi select clock signals c1-c5, which are supplied to the successive approximation register (SAR) 22 shown in a right portion of FIG. 8.

To the signal input terminal and control input terminal of a clocked inverter Inv11A, the second clock signal cks1 and the inverted signal of the select signal Sel1 are supplied, respectively. The inverter Inv11B is supplied with an output signal from the clocked inverter Inv11A and produces a first select clock signal c1.

To a signal input terminal and a control input terminal of a clocked inverter Inv12A, the second clock signal cks1 and select signal Sel1 are supplied respectively. To a signal input terminal and a control input terminal of a clocked inverter Inv12B, an output signal from the clocked inverter Inv12A and the inverted signal of the select signal Sel2 are supplied, respectively. The output signal of the clocked inverter Inv12B is supplied to a first input terminal of an OR circuit OR2, and then a second select clock signal c2 arises from an output terminal of the OR circuit OR2.

Figure 13:
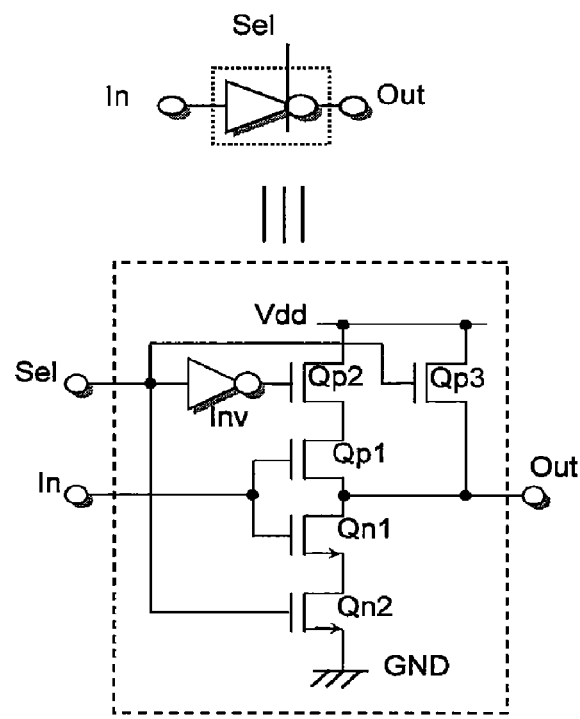
FIG. 13 is a diagram showing a layout of clocked inverters of the clock select circuit of FLL of FIG. 7.

FIG. 13 is a diagram showing a layout of clocked inverters of the clock select circuit (CS) 24 of FLL of FIG. 7, which include the inverters Inv11A, Inv11B, etc. As shown in FIG. 13, the plurality of clocked inverters Inv11A, Inv11B, etc. are each an inverter such that signal transmission from its input terminal In to output terminal Out, through which a transmitted signal is inverted, is controlled to be executed in either Enable mode or Disable mode.

When a control signal of High level "1" is supplied to the control input terminal Sel of each clocked inverter, the NMOS transistor Qn2 and PMOS transistor Qp2 inside the clocked inverter are controlled to ON state, and the CMOS transistors Qn1 and Qp1 invert a signal which has come at the input terminal In, whereby the output terminal Out can be driven. Further, when a control signal of Low level "0" is supplied to the control input terminal Sel of each clocked inverter, the NMOS transistor Qn2 and PMOS transistor Qp2 inside the clocked inverter are controlled to OFF state. Then, the CMOS transistors Qn1 and Qp1 are also brought into OFF state, and thus the activation of the output terminal Out is stopped. In this Disable mode, the PMOS transistor Qp3 having a small driving power weakly pulls up the output terminal Out to the level of the source voltage Vdd, which is High level "1".

When select signals Sel1, Sel2 and Sel3, which are all at High level "1", are supplied from the control data storing circuit (LUT) 25 to the clock select circuit (CS) 24 shown in the left portion of FIG. 8, the clocked inverters Inv12A, Inv13A and Inv14A in the clock select circuit (CS) 24 are brought into Enable mode. Thus, the second clock signal cks1 from the control clock generating circuit (CCG) 23 is transmitted to the first input terminal of the OR circuit OR4 through the clocked inverters Inv12A, Inv13A and Inv14A and the inverter Inv14B in the clock select circuit (CS) 24. As a result, the fourth multi select clock signal c4 arises from the output of the OR circuit OR4 of the clock select circuit (CS) 24 in response to the second clock signal cks1 from the control clock generating circuit (CCG) 23.

In addition, the clocked inverters Inv22A, Inv23A and Inv24A in the clock select circuit (CS) 24 are brought into Enable mode. Then, the third clock signal cks2 from the control clock generating circuit (CCG) 23 is transmitted to the first input terminal of the OR circuit OR5 through the clocked inverters Inv22A, Inv23A and Inv24A and the inverter Inv24B in the clock select circuit (CS) 24. As a result, the fifth multi select clock signal c5 arises from the output of the OR circuit OR5 of the clock select circuit (CS) 24 in response to the third clock signal cks2 from the control clock generating circuit (CCG) 23.

<<Initial Setting of Upper Three Bits of the Successive Approximation Register>>

Figure 9:
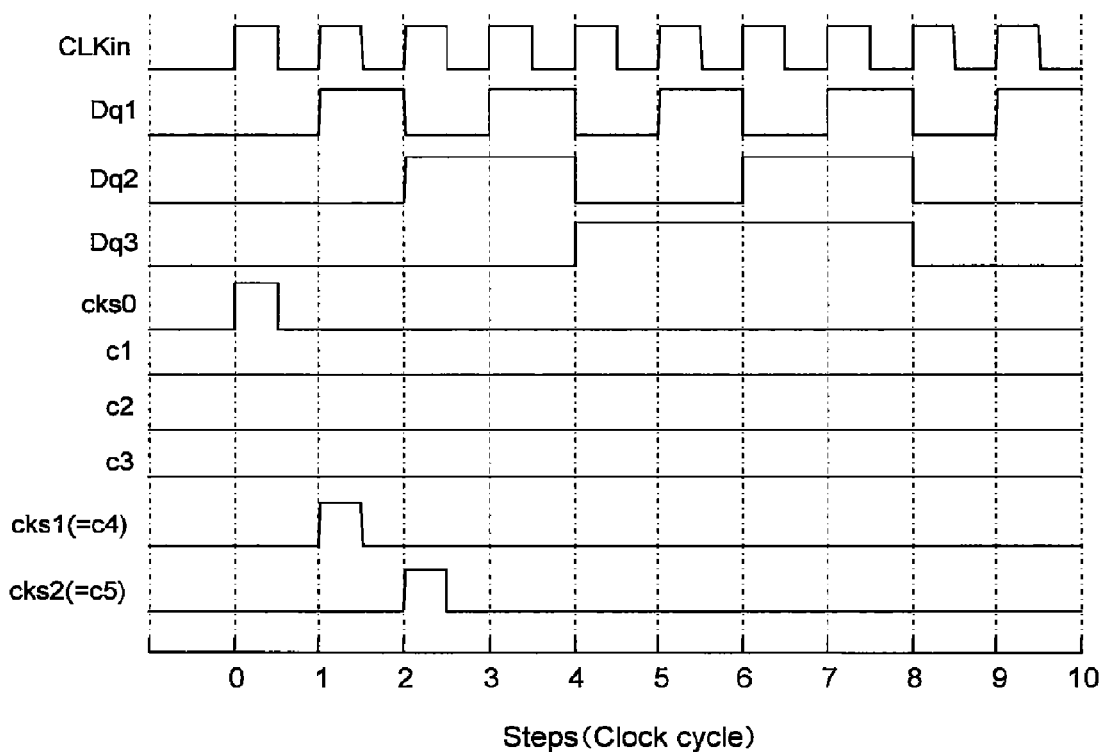
FIG. 9 is a diagram showing waveforms in respective parts of FLL in case that the select signals Sel1, Sel2 and Sel3 all at High level are supplied to the clock select circuit from the control data storing circuit in FLL as shown in FIG. 7, illustrating the way the set delay stage umber of the digital control oscillator is set.

FIG. 9 is a diagram showing waveforms in the respective parts of FLL in case that the select signals Sel1, Sel2 and Sel3 all at High level "1" are supplied to the clock select circuit (CS) 24 from the control data storing circuit (LUT) 25 in FLL as shown in FIG. 7, illustrating the way the set delay stage umber N of the digital control oscillator 10 is set.

It is assumed that supplying an input clock signal $CLK_{in}$ having a reference frequency $f_{REF}$ to FLL shown in FIG. 7 has already started, and the multiplication number H of the program counter 32 has been set to a predetermined value to start FLL (shown in FIG. 7) locking at Step 0 of FIG. 9. First, in an initial condition before Step 0, the noninverted-data output terminals Dq1-Dq3 of the three flip-flops FF6-FF8 of the control clock generating circuit (CCG) 23 are all at Low level "0", and the inverted-data output terminals Dq1b-Dq3b are all at High level "1".

In this condition, when an input clock signal $CLK_{in}$ of High level "1" is supplied to the control clock generating circuit (CCG) 23 of FIG. 5 in keeping with the timing of Step 0 of FIG. 9, the first clock signal cks0 of High level "1" arises from the output terminal of the first AND gate AND1. The first clock signal cks0 of High level "1" arising from the output terminal of the first AND gate AND1 is commonly supplied to the reset terminals R of the four flip-flops FF6-FF9, and therefore the four flip-flops FF6-FF9 are all driven to the reset states. As a result, the noninverted-data output terminals Dq1-Dq4 of the four flip-flops FF6-FF9 are all at Low level "0", and the inverted-data output terminals Dq1b-Dq3b of the three flip-flops FF6-FF8 are all at High level "1".

On the other hand, in response to the first clock signal cks0 of High level "1" at Step 0 of FIG. 9, initial set data of upper three bits of signals Set1-Set3 of the initial setting control signals Set1-Set5 arising from the control data storing circuit 25 are stored in the flip-flops FF1-FF3 for upper three bit signals in the successive approximation register 22. The initial set data stored in the flip-flops FF1-FF3 for upper three bit signals are any of the following eight data: "000", "001", "010", "011", "100", "101", "110" and "111". Incidentally, at this time, the data "00" is stored in the flip-flops FF4 and FF5 for lower two bit signals in the successive approximation register (SAR) 22 as described above.

<<Setting of Lower Two Bits with an Output from the Frequency Comparator>>

Figure 6:
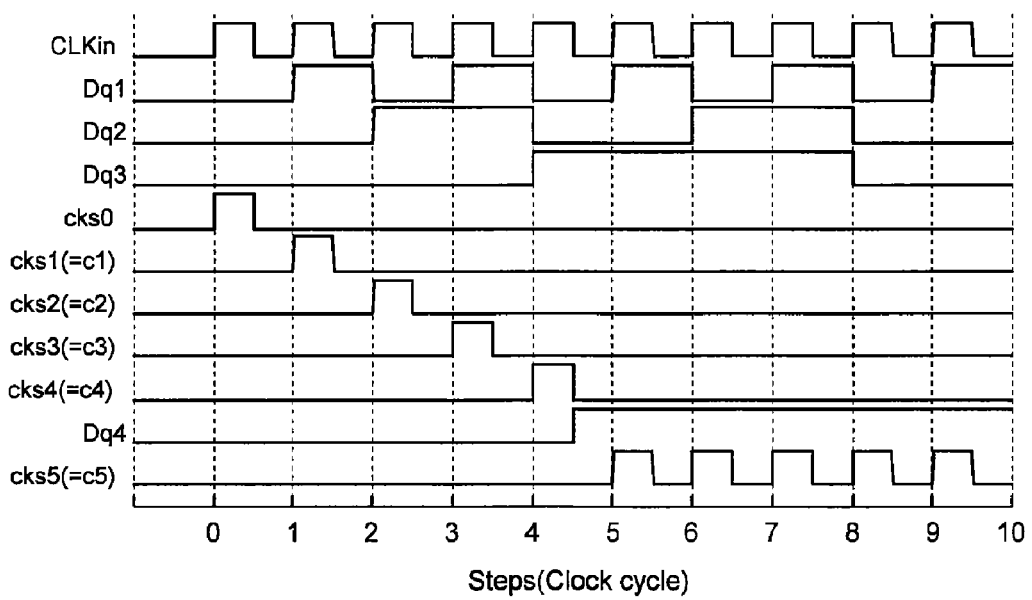
FIG. 6 is a diagram showing waveforms in the successive approximation register and control clock generating circuit in the digital control part shown in FIG. 5, illustrating the way the set delay stage umber of the digital control oscillator is decided in FLL of FIG. 1.

Like the action taken at Step 1 of FIG. 6, the input clock signal $CLK_{in}$ is changed from Low level "0" to High level "1" at Step 1 of FIG. 9, the second clock signal cks1 of High level "1" arises from the control clock generating circuit (CCG) 23. At this time, select signals Sel1, Sel2 and Sel3 all at High level "1" are supplied to the clock select circuit (CS) 24 of FIG. 8 from the control data storing circuit (LUT) 25. Therefore, at Step 1 of FIG. 9, the fourth multi select clock signal c4 of High level "1" arises from the output of the OR circuit OR4 of the clock select circuit (CS) 24 in response to the second clock signal cks1 of High level "1" from the control clock generating circuit (CCG) 23.

Incidentally, at this time, the comparison output signal $FD_{out}$ is produced by the frequency comparator (FD) 31, which is a result of the first oscillating action by the digital control oscillator of FLL of FIG. 7 utilizing initial set data in the successive approximation register (SAR) 22 at Step 0. The comparison output signal $FD_{out}$ of Low level "0" indicates that the frequency is low. At Step 1 of FIG. 9, the comparison output signal $FD_{out}$ of Low level "0" is stored in the fourth bit flip-flop FF4 of the successive approximation register 22 in response to the second clock signal cks1 and fourth multi select clock signal c4 of High level "1". In contrast, the comparison output signal $FD_{out}$ of High level "1" indicates that the frequency is high. The comparison output signal $FD_{out}$ of High level "1" is stored in the fourth bit flip-flop FF4 of the successive approximation register 22 in response to the second clock signal cks1 and fourth multi select clock signal c4 of High level "1" at Step 1 of FIG. 9. Also, at Step 1 of FIG. 9, the first to third multi select clock signals c1-c3 from the clock select circuit (CS) 24 are all at Low level "0". As a result, it is possible to inhibit data overwrite of initial set data stored in the flip-flops FF1-FF3 for upper three bit signals in the successive approximation register (SAR) 22 at Step 0 of FIG. 9.

Like the action taken at Step 2 of FIG. 6, when the input clock signal $CLK_{in}$ is changed from Low level "0" to High level "1" at Step 2 of FIG. 9, the third clock signal cks2 of High level "1" arises from the control clock generating circuit (CCG) 23. At this time, the select signals Sel1, Sel2 and Sel3 of High level "1" are supplied to the clock select circuit (CS) 24 of FIG. 8 from the control data storing circuit (LUT) 25. Therefore, the fifth multi select clock signal c5 of High level "1" arises from the output of the OR circuit OR5 in the clock select circuit (CS) 24 in response to the third clock signal cks2 of High level "1" from the control clock generating circuit (CCG) 23 at Step 2 of FIG. 9.

Incidentally, at this time, the comparison output signal $FD_{out}$ is produced by the frequency comparator (FD) 31, which is a result of the second oscillating action by the digital control oscillator of FLL of FIG. 7 utilizing set data in the successive approximation register (SAR) 22 at Step 1. The comparison output signal $FD_{out}$ of Low level "0" indicates that the frequency is low. At Step 2 of FIG. 9, the comparison output signal $FD_{out}$ of Low level "0" is stored in the fifth bit flip-flop FF5 of the successive approximation register 22 in response to the third clock signal cks2 and fifth multi select clock signal c5 of High level "1". In contrast, the comparison output signal $FD_{out}$ of High level "1" indicates that the frequency is high. The comparison output signal $FD_{out}$ of High level "1" is stored in the fifth bit flip-flop FF5 of the successive approximation register 22 in response to the third clock signal cks2 and fifth multi select clock signal c5 of High level "1" at Step 2 of FIG. 9. Also, at Step 2 of FIG. 9, the first to fourth multi select clock signals c1-c4 from the clock select circuit (CS) 24 are all at Low level "0". As a result, it is possible to inhibit data overwrite of set data stored in the flip-flops FF1-FF4 for upper four bit signals in the successive approximation register (SAR) 22 at Step 0 of FIG. 9.

In the case of FIG. 9, initial setting control signals Set1-Set3 of upper three bit signals from the control data storing circuit 25 are stored in the flip-flops FF1-FF3 for upper three bit signals in the successive approximation register 22 at Step 0. Therefore, setting of the set delay stage umber N of the digital control oscillator 10 can be completed at a high speed until Step 2.

<<Initial Setting of Upper Two Bits of the Successive Approximation Register>>

Figure 10:
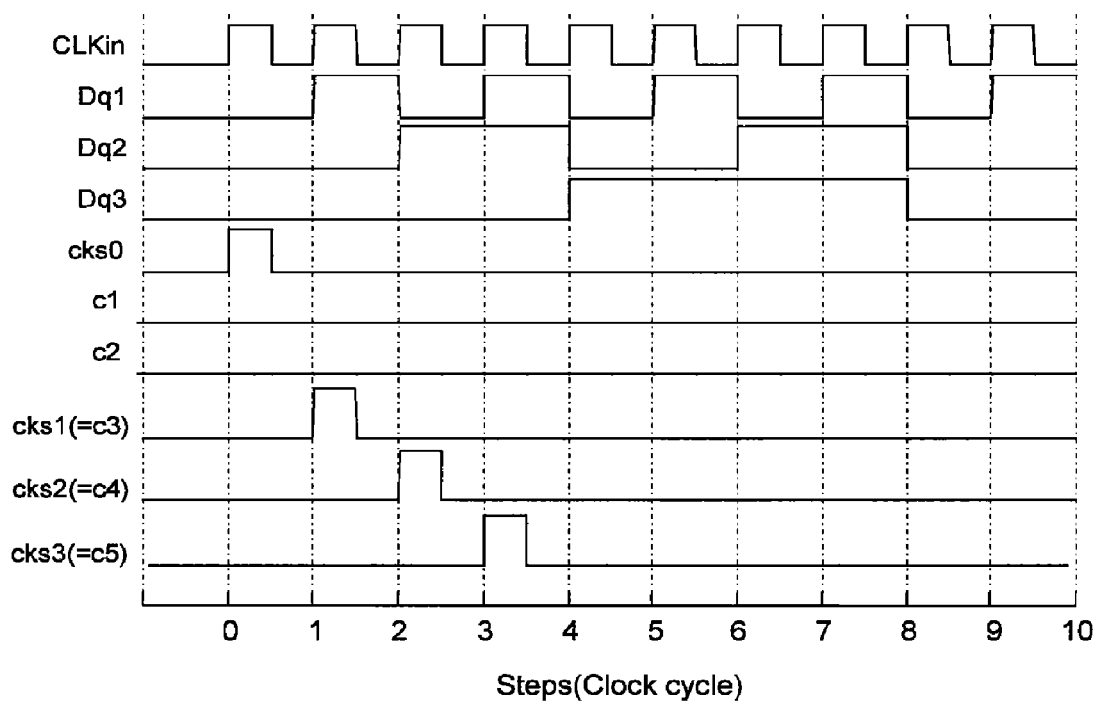
FIG. 10 is a diagram showing waveforms in the respective parts of FLL of FIG. 7 in case that select signals Sel1, Sel2 and Sel3 making the data "110" are supplied to the clock select circuit from the control data storing circuit in FLL, illustrating the way the set delay stage umber of the digital control oscillator is set.

FIG. 10 is a diagram showing waveforms in the respective parts of FLL of FIG. 7 in case that select signals Sel1, Sel2 and Sel3 making the data "110" are supplied to the clock select circuit (CS) 24 from the control data storing circuit (LUT) 25 in FLL, illustrating the way the set delay stage umber N of the digital control oscillator 10 is set.

It is assumed that supplying an input clock signal $CLK_{in}$ having a reference frequency $f_{REF}$ to FLL shown in FIG. 1 has already started, and the multiplication number M of the program counter 32 has been set to a predetermined value to start FLL (shown in FIG. 7) locking at Step 0 of FIG. 10. First, in an initial condition before Step 0, the noninverted-data output terminals Dq1-Dq3 of the three flip-flops FF6-FF8 of the control clock generating circuit (CCG) 23 are all at Low level "0", and the inverted-data output terminals Dq1b-Dq3b are all at High level "1".

In this condition, when an input clock signal $CLK_{in}$ of High level "1" is supplied to the control clock generating circuit (CCG) 23 of FIG. 5 in keeping with the timing of Step 0 of FIG. 10, the first clock signal cks0 of High level "1" arises from the output terminal of the first AND gate AND1. The first clock signal cks0 of High level "1" arising from the output terminal of the first AND gate AND1 is commonly supplied to the reset terminals R of the four flip-flops FF6-FF9, and therefore the four flip-flops FF6-FF9 are all driven to the reset states. As a result, the noninverted-data output terminals Dq1-Dq4 of the four flip-flops FF6-FF9 are all at Low level "0", and the inverted-data output terminals Dq1b-Dq3b of the three flip-flops FF6-FF8 are all at High level "1".

On the other hand, in response to the first clock signal cks0 of High level "1" at Step 0 of FIG. 10, initial set data of upper two bits of signals Set1 and Set2 of the initial setting control signals Set1-Set5 arising from the control data storing circuit 25 are stored in the flip-flops FF1 and FF2 for upper two bit signals in the successive approximation register 22. The initial set data stored in the flip-flops FF1 and FF2 for upper two bit signals are any of the following four data: "00", "01", "10" and "11". Incidentally, at this time, the data "000" is stored in the flip-flops FF3-FF5 for lower three bit signals in the successive approximation register (SAR) 22.

<<Setting of Lower Three Bits with an Output from the Frequency Comparator>>

Like the action taken at Step 1 of FIG. 6, when the input clock signal $CLK_{in}$ is changed from Low level "0" to High level "1" at Step 1 of FIG. 10, the second clock signal cks1 of High level "1" arises from the control clock generating circuit (CCG) 23. At this time, the select signals Sel1, Sel2 and Sel3 making the data "110" are supplied to the clock select circuit (CS) 24 of FIG. 8 from the control data storing circuit (LUT) 25. Therefore, the third multi select clock signal c3 of High level "1" arises from the output of the OR circuit OR3 in the clock select circuit (CS) 24 in response to the second clock signal cks1 of High level "1" from the control clock generating circuit (CCG) 23 at Step 1 of FIG. 10.

Incidentally, at this time, the comparison output signal $FD_{out}$ is produced by the frequency comparator (FD) 31, which is a result of the first oscillating action by the digital control oscillator of FLL of FIG. 7 utilizing initial set data in the successive approximation register (SAR) 22 at Step 0. The comparison output signal $FD_{out}$ of Low level "0" indicates that the frequency is low. At Step 1 of FIG. 10, the comparison output signal $FD_{out}$ of Low level "0" is stored in the third bit flip-flop FF3 of the successive approximation register 22 in response to the second clock signal cks1 and third multi select clock signal c3 of High level "1". In contrast, the comparison output signal $FD_{out}$ of High level "1" indicates that the frequency is high. The comparison output signal $FD_{out}$ of High level "1" is stored in the third bit flip-flop FF3 of the successive approximation register 22 in response to the second clock signal cks1 and third multi select clock signal c3 of High level "1" at Step 1 of FIG. 10. Also, at Step 1 of FIG. 10, the first multi select clock signal c1 and second multi select clock signal c2 from the clock select circuit (CS) 24 are all at Low level "0". As a result, it is possible to inhibit data overwrite of initial set data stored in the flip-flops FF1 and FF2 for upper two bit signals in the successive approximation register (SAR) 22 at Step 0 of FIG. 10.

Like the action taken at Step 2 of FIG. 6, when the input clock signal $CLK_{in}$ is changed from Low level "0" to High level "1" at Step 2 of FIG. 10, the third clock signal cks2 of High level "1" arises from the control clock generating circuit (CCG) 23. At this time, the select signals Sel1, Sel2 and Sel3 making the data "110" are supplied to the clock select circuit (CS) 24 of FIG. 8 from the control data storing circuit (LUT) 25. Therefore, the fourth multi select clock signal c4 of High level "1" arises from the output of the OR circuit OR4 in the clock select circuit (CS) 24 in response to the third clock signal cks2 of High level "1" from the control clock generating circuit (CCG) 23 at Step 2 of FIG. 10.

Incidentally, at this time, the comparison output signal $FD_{out}$ is produced by the frequency comparator (FD) 31, which is a result of the second oscillating action by the digital control oscillator of FLL of FIG. 7 utilizing set data in the successive approximation register (SAR) 22 at Step 1. The comparison output signal $FD_{out}$ of Low level "0" indicates that the frequency is low. At Step 2 of FIG. 10, the comparison output signal $FD_{out}$ of Low level "0" is stored in the fourth bit flip-flop FF4 of the successive approximation register 22 in response to the third clock signal cks2 and fourth multi select clock signal c4 of High level "1". In contrast, the comparison output signal $FD_{out}$ of High level "1" indicates that the frequency is high. The comparison output signal $FD_{out}$ of High level "1" is stored in the fourth bit flip-flop FF4 of the successive approximation register 22 in response to the third clock signal cks2 and fourth multi select clock signal c4 of High level "1" at Step 2 of FIG. 10. Also, at Step 2 of FIG. 10, the first to third multi select clock signals c1-c3 from the clock select circuit (CS) 24 are all at Low level "0". As a result, it is possible to inhibit data overwrite of set data stored in the flip-flops FF1-FF3 for upper three bit signals in the successive approximation register (SAR) 22 at Step 0 of FIG. 10.

Like the action taken at Step 3 of FIG. 6, when the input clock signal $CLK_{in}$ is changed from Low level "0" to High level "1" at Step 3 of FIG. 10, the fourth clock signal cks3 of High level "1" arises from the control clock generating circuit (CCG) 23. At this time, the select signals Sel1, Sel2 and Sel3 making the data "110" are supplied to the clock select circuit (CS) 24 of FIG. 8 from the control data storing circuit (LUT) 25. Therefore, the fifth multi select clock signal c5 of High level "1" arises from the output of the OR circuit OR4 in the clock select circuit (CS) 24 in response to the fourth clock signal cks3 of High level "1" from the control clock generating circuit (CCG) 23 at Step 2 of FIG. 10.

Also, at this time, the comparison output signal $FD_{out}$ is produced by the frequency comparator (FD) 31, which is a result of the third oscillating action by the digital control oscillator of FLL of FIG. 7 utilizing set data in the successive approximation register (SAR) 22 at Step 2. The comparison output signal $FD_{out}$ of Low level "0" indicates that the frequency is low. At Step 3 of FIG. 10, the comparison output signal $FD_{out}$ of Low level "0" is stored in the fifth bit flip-flop FF5 of the successive approximation register 22 in response to the fourth clock signal cks3 and fifth multi select clock signal c5 of High level "1". In contrast, the comparison output signal $FD_{out}$ of High level "1" indicates that the frequency is high. The comparison output signal $FD_{out}$ of High level "1" is stored in the fifth bit flip-flop FF5 of the successive approximation register 22 in response to the fourth clock signal cks3 and fifth multi select clock signal c5 of High level "1" at Step 3 of FIG. 10. Also, at Step 3 of FIG. 10, the first to fourth multi select clock signals c1-c4 from the clock select circuit (CS) 24 are all at Low level "0". As a result, it is possible to inhibit data overwrite of set data stored in the flip-flops FF1-FF4 for upper four bit signals in the successive approximation register (SAR) 22 at Step 0 of FIG. 10.

In this case of FIG. 10, initial setting control signals Set1 and Set2 for upper two bit signals from the control data storing circuit 25 stored in the flip-flops FF1 and FF2 for upper two bit signals in the successive approximation register 22 at Step 0, and therefore setting of the set delay stage umber N of the digital control oscillator 10 can be completed at a relatively high speed until Step 3.

<<Initial Setting of Upper One bit of the Successive Approximation Register>>

Figure 11:
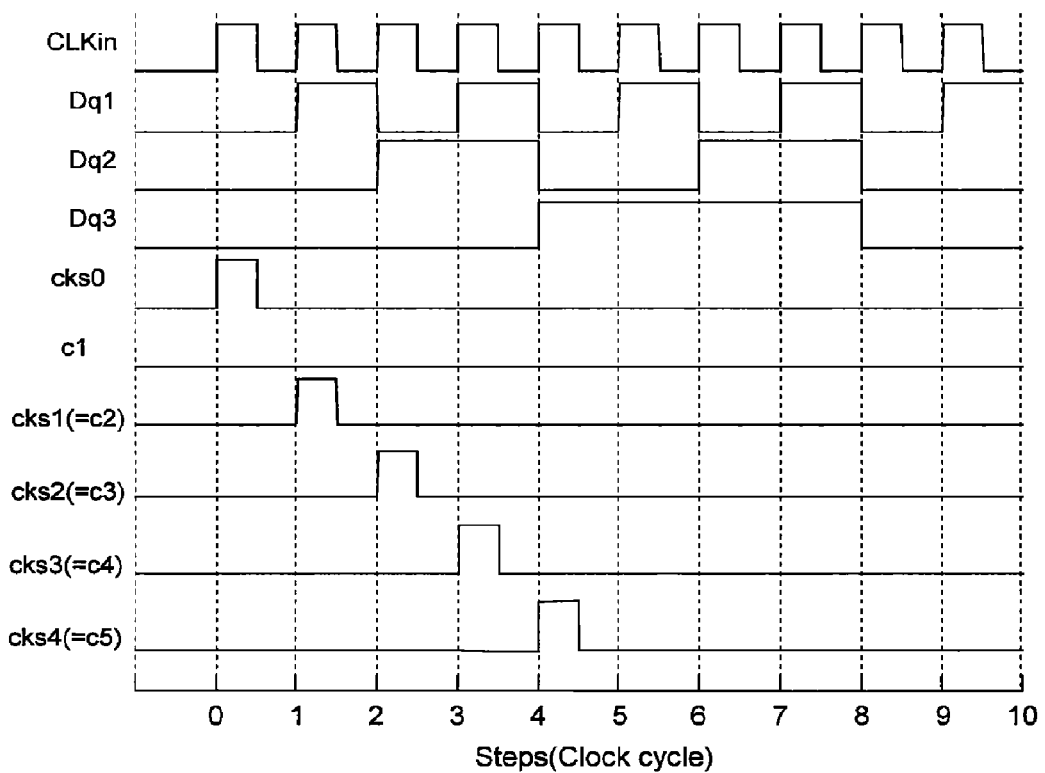
FIG. 11 is a diagram showing waveforms in the respective parts of FLL of FIG. 7 in case that select signals Sel1, Sel2 and Sel3 making the data "100" are supplied to the clock select circuit from the control data storing circuit in FLL, illustrating the way the set delay stage umber of the digital control oscillator 10 is set.

FIG. 11 is a diagram showing waveforms in the respective parts of FLL of FIG. 7 in case that select signals Sel1, Sel2 and Sel3 making the data "100" are supplied to the clock select circuit (CS) 24 from the control data storing circuit (LUT) 25 in FLL, illustrating the way the set delay stage umber N of the digital control oscillator 10 is set.

It is assumed that supplying an input clock signal $CLK_{in}$ having a reference frequency $f_{REF}$ to FLL shown in FIG. 1 has already started, and the multiplication number M of the program counter 32 has been set to a predetermined value to start FLL of FIG. 7 locking at Step 0 of FIG. 11. First, in an initial condition before Step 0, the noninverted-data output terminals Dq1-Dq3 of the three flip-flops FF6-FF8 of the control clock generating circuit (CCG) 23 are all at Low level "0", and the inverted-data output terminals Dq1b-Dq3b are all at High level "1".

In this condition, when an input clock signal $CLK_{in}$ of High level "1" is supplied to the control clock generating circuit (CCG) 23 of FIG. 5 in keeping with the timing of Step 0 of FIG. 11, the first clock signal cks0 of High level "1" arises from the output terminal of the first AND gate AND1. The first clock signal cks0 of High level "1" arising from the output terminal of the first AND gate AND1 is commonly supplied to the reset terminals R of the four flip-flops FF6-FF9, and therefore the four flip-flops FF6-FF9 are all driven to the reset states. As a result, the noninverted-data output terminals Dq1-Dq4 of the four flip-flops FF6-FF9 are all at Low level "0", and the inverted-data output terminals Dq1b-Dq3b of the three flip-flops FF6-FF8 are all at High level "1".

On the other hand, in response to the first clock signal cks0 of High level "1" at Step 0 of FIG. 11, initial set data of upper one bit of signal Set' of the initial setting control signals Set1-Set5 arising from the control data storing circuit 25 are stored in the flip-flop FF1 for upper one bit signal in the successive approximation register 22. The initial set data stored in the flip-flop FF1 for the upper one bit signal is any of the following two data: "0" and "1". Incidentally, at this time, the data "0000" is stored in the flip-flops FF2-FF5 for lower four bit signals in the successive approximation register (SAR) 22.

<<Setting Lower Four Bits with an Output from the Frequency Comparator>>

Like the action taken at Step 1 of FIG. 6, when the input clock signal $CLK_{in}$ is changed from Low level "0" to High level "1" at Step 1 of FIG. 11, the second clock signal cks1 of High level "1" arises from the control clock generating circuit (CCG) 23. At this time, the select signals Sel1, Sel2 and Sel3 making the data "100" are supplied to the clock select circuit (CS) 24 of FIG. 8 from the control data storing circuit (LUT) 25. Therefore, the second multi select clock signal c2 of High level "1" arises from the output of the OR circuit OR2 in the clock select circuit (CS) 24 in response to the second clock signal cks1 of High level "1" from the control clock generating circuit (CCG) 23 at Step 1 of FIG. 11.

Incidentally, at this time, the comparison output signal $FD_{out}$ is produced by the frequency comparator (FD) 31, which is a result of the first oscillating action by the digital control oscillator of FLL of FIG. 7 utilizing initial set data in the successive approximation register (SAR) 22 at Step 0. The comparison output signal $FD_{out}$ of Low level "0" indicates that the frequency is low. At Step 1 of FIG. 11, the comparison output signal $FD_{out}$ of Low level "0" is stored in the second bit flip-flop FF2 of the successive approximation register 22 in response to the second clock signal cks1 and second multi select clock signal c2 of High level "1". In contrast, the comparison output signal $FD_{out}$ of High level "1" indicates that the frequency is high. The comparison output signal $FD_{out}$ of High level "1" is stored in the second bit flip-flop FF2 of the successive approximation register 22 in response to the second clock signal cks1 and second multi select clock signal c2 of High level "1" at Step 1 of FIG. 11. Also, at Step 1 of FIG. 11, the first multi select clock signal c1 from the clock select circuit (CS) 24 is at Low level "0". As a result, it is possible to inhibit data overwrite of initial set data stored in the flip-flop FF1 for the upper one bit signal in the successive approximation register (SAR) 22 at Step 0 of FIG. 11.

Like the action taken at Step 2 of FIG. 6, when the input clock signal $CLK_{in}$ is changed from Low level "0" to High level "1" at Step 2 of FIG. 11, the third clock signal cks2 of High level "1" arises from the control clock generating circuit (CCG) 23. At this time, the select signals Sel1, Sel2 and Sel3 making the data "100" are supplied to the clock select circuit (CS) 24 of FIG. 8 from the control data storing circuit (LUT) 25. Therefore, the third multi select clock signal c3 of High level "1" arises from the output of the OR circuit OR3 in the clock select circuit (CS) 24 in response to the third clock signal cks2 of High level "1" from the control clock generating circuit (CCG) 23 at Step 2 of FIG. 10.

Incidentally, at this time, the comparison output signal $FD_{out}$ is produced by the frequency comparator (FD) 31, which is a result of the second oscillating action by the digital control oscillator of FLL of FIG. 7 utilizing set data in the successive approximation register (SAR) 22 at Step 1. The comparison output signal $FD_{out}$ of Low level "0" indicates that the frequency is low. At Step 2 of FIG. 11, the comparison output signal $FD_{out}$ of Low level "0" is stored in the third bit flip-flop FF3 of the successive approximation register 22 in response to the third clock signal cks2 and third multi select clock signal c3 of High level "1". In contrast, the comparison output signal $FD_{out}$ of High level "1" indicates that the frequency is high. The comparison output signal $FD_{out}$ of High level "1" is stored in the third bit flip-flop FF3 of the successive approximation register 22 in response to the third clock signal cks2 and third multi select clock signal c3 of High level "1" at Step 2 of FIG. 11. Also, at Step 2 of FIG. 11, the first and second multi select clock signals c1 and c2 from the clock select circuit (CS) 24 are all at Low level "0". As a result, it is possible to inhibit data overwrite of set data stored in the flip-flops FF1 and FF2 for upper two bit signals in the successive approximation register (SAR) 22 at Step 0 of FIG. 11.

Like the action taken at Step 3 of FIG. 6, when the input clock signal $CLK_{in}$ is changed from Low level "0" to High level "1" at Step 3 of FIG. 11, the fourth clock signal cks3 of High level "1" arises from the control clock generating circuit (CCG) 23. At this time, the select signals Sel1, Sel2 and Sel3 making the data "100" are supplied to the clock select circuit (CS) 24 of FIG. 8 from the control data storing circuit (LUT) 25. Therefore, the fourth multi select clock signal c4 of High level "1" arises from the output of the OR circuit OR3 in the clock select circuit (CS) 24 in response to the fourth clock signal cks3 of High level "1" from the control clock generating circuit (CCG) 23 at Step 3 of FIG. 11.

Incidentally, at this time, the comparison output signal $FD_{out}$ is produced by the frequency comparator (FD) 31, which is a result of the third oscillating action by the digital control oscillator of FLL of FIG. 7 utilizing set data in the successive approximation register (SAR) 22 at Step 1. The comparison output signal $FD_{out}$ of Low level "0" indicates that the frequency is low. At Step 3 of FIG. 11, the comparison output signal $FD_{out}$ of Low level "0" is stored in the fourth bit flip-flop FF4 of the successive approximation register 22 in response to the fourth clock signal cks4 and fourth multi select clock signal c4 of High level "1". In contrast, the comparison output signal $FD_{out}$ of High level "1" indicates that the frequency is high. The comparison output signal $FD_{out}$ of High level "1" is stored in the fourth bit flip-flop FF4 of the successive approximation register 22 in response to the fourth clock signal cks4 and fourth multi select clock signal c4 of High level "1" at Step 3 of FIG. 11. Also, at Step 3 of FIG. 11, the first to third multi select clock signals c1-c3 from the clock select circuit (CS) 24 are all at Low level "0".

As a result, it is possible to inhibit data overwrite of set data stored in the flip-flops FF1-FF3 for upper three bit signals in the successive approximation register (SAR) 22 at Step 0 of FIG. 11.

Like the action taken at Step 4 of FIG. 6, when the input clock signal $CLK_{in}$ is changed from Low level "0" to High level "1" at Step 4 of FIG. 11, the fifth clock signal cks4 of High level "1" arises from the control clock generating circuit (CCG) 23. At this time, the select signals Sel1, Sel2 and Sel3 making the data "100" are supplied to the clock select circuit (CS) 24 of FIG. 8 from the control data storing circuit (LUT) 25. Therefore, the fifth multi select clock signal c5 of High level "1" arises from the output of the OR circuit OR5 in the clock select circuit (CS) 24 in response to the fifth clock signal cks4 of High level "1" from the control clock generating circuit (CCG) 23 at Step 4 of FIG. 11.

Also, at this time, the comparison output signal $FD_{out}$ is produced by the frequency comparator (FD) 31, which is a result of the fourth oscillating action by the digital control oscillator of FLL of FIG. 7 utilizing set data in the successive approximation register (SAR) 22 at Step 3. The comparison output signal $FD_{out}$ of Low level "0" indicates that the frequency is low. At Step 4 of FIG. 11, the comparison output signal $FD_{out}$ of Low level "0" is stored in the fifth bit flip-flop FF5 of the successive approximation register 22 in response to the fifth clock signal cks4 and fifth multi select clock signal c5 of High level "1". In contrast, the comparison output signal FD$_{out}$ of High level "1" indicates that the frequency is high. The comparison output signal FD$_{out}$ of High level "1" is stored in the fifth bit flip-flop FF5 of the successive approximation register 22 in response to the fifth clock signal cks4 and fifth multi select clock signal c5 of High level "1" at Step 4 of FIG. 11. Also, at Step 4 of FIG. 11, the first to fourth second multi select clock signals cl-c4 from the clock select circuit (CS) 24 are all at Low level "0". As a result, it is possible to inhibit data overwrite of set data stored in the flip-flops FF1-FF4 for upper four bit signals in the successive approximation register (SAR) 22 at Step 0 of FIG. 11.

In this case of FIG. 11, the initial setting control signal Set1 for the upper one bit signal from the control data storing circuit 25 is stored in the flip-flop FF1 for the upper one bit signal in the successive approximation register 22 at Step 0, and therefore setting of the set delay stage umber N of the digital control oscillator 10 can be completed at a relatively high speed until Step 4.

<<Case of No Initial Setting on the Successive Approximation Register >>

Figure 12:
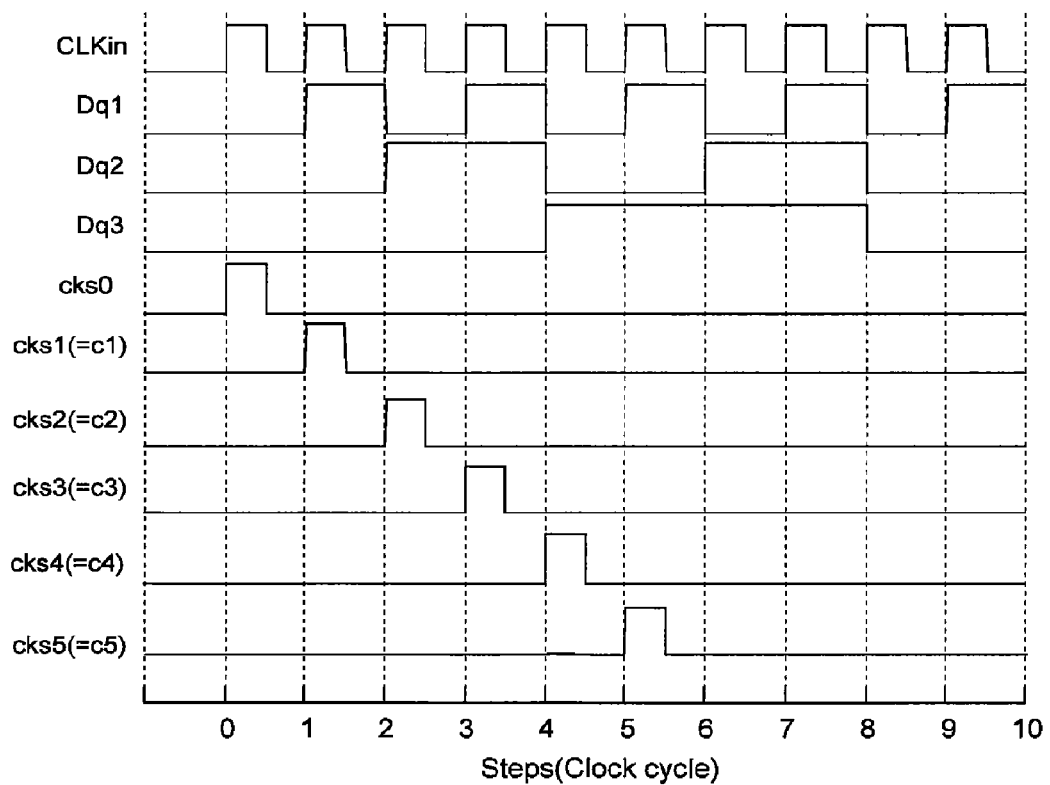
FIG. 12 is a diagram showing waveforms in the respective parts of FLL of FIG. 7 in case that select signals Sel1, Sel2 and Sel3 making the data "000" are supplied to the clock select circuit from the control data storing circuit in FLL, illustrating the way the set delay stage umber of the digital control oscillator is set.

FIG. 12 is a diagram showing waveforms in the respective parts of FLL of FIG. 7 in case that select signals Sel1, Sel2 and Sel3 making the data "000" are supplied to the clock select circuit (CS) 24 from the control data storing circuit (LUT) 25 in FLL, illustrating the way the set delay stage umber N of the digital control oscillator 10 is set.

In the above description, the number of bits of the successive approximation register (SAR) 22 in the digital control part 20 of FLL as shown in FIG. 7 is five. However, in order to handle the variable multiplication number M of the 11-bit program counter 32 of up to the maximum 2047, the actual bit number of the successive approximation register (SAR) 22 is twelve. Consequently, upper bits of the set delay stage umber N of the successive approximation register (SAR) 22 corresponding to all of the multiplication numbers M supplied to the program counter (PC) 32 through the input terminal Min for setting a multiplication number cannot be stored in the control data storing circuit (LUT) 25 because of limitation of the memory capacity of the control data storing circuit (LUT) 25.

Figure 3:
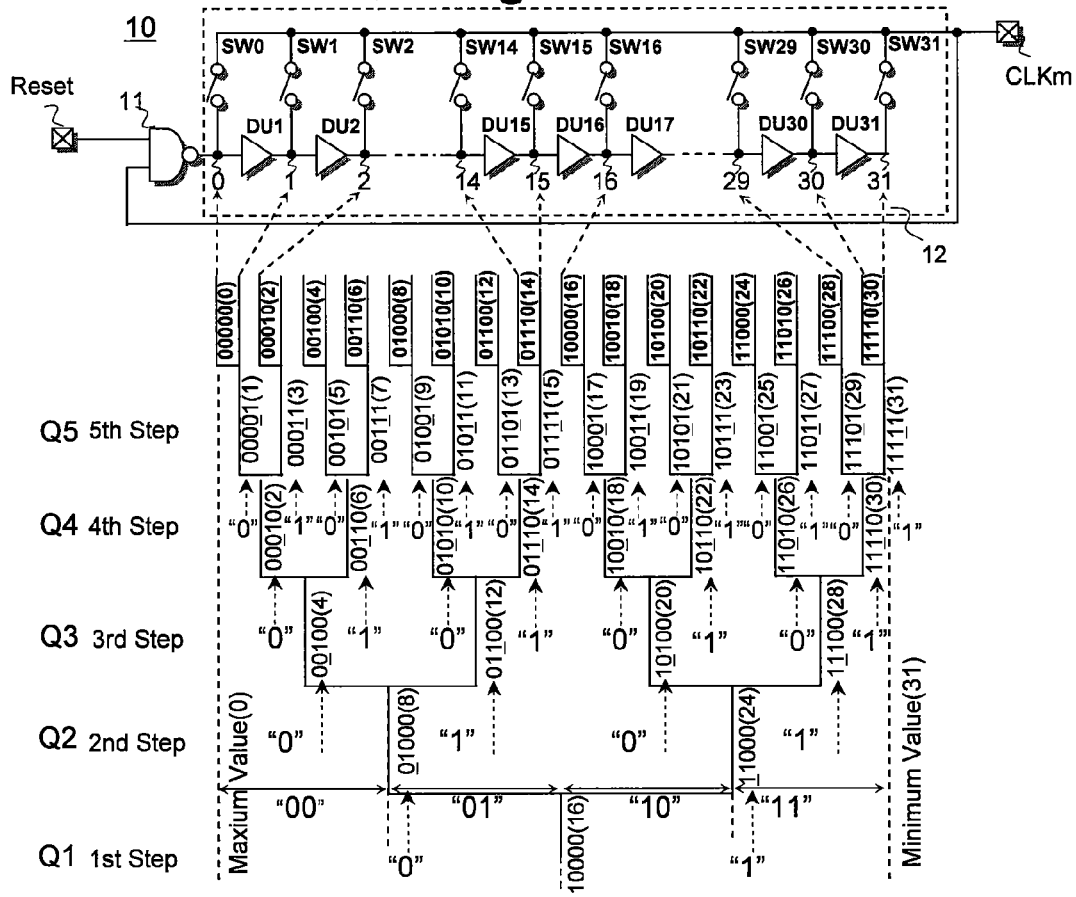
FIG. 3 is a diagram for explaining the way the successive approximation register decides the set delay stage umber of the digital control oscillator when the reference frequency, multiplication number and unit delay amount have been known, in FLL shown in FIG. 1, which has been examined by the inventors prior to the invention.

When a multiplication number M which does not correspond to an upper bit of a set delay stage umber N stored in the control data storing circuit (LUT) 25 is supplied through the input terminal Min for setting a multiplication number, the control data storing circuit (LUT) 25 supplies the clock select circuit (CS) 24 with select signals Sel1, Sel2 and Sel3 making the data "000" showing that selection for initial setting cannot be made. Then, in the clock select circuit (CS) 24, the clocked inverters Inv11A, Inv21A, Inv31A, Inv41A and Inv51A are made active. As a result, multi-clock signals cks1-cks5 from the control clock generating circuit 23 are output as the multi select clock signals c1-c5 of the clock select circuit (CS) 24. Also, at this time, the control data storing circuit (LUT) 25 produces initial setting control signals Set1, Set2, Set3, Set4 and Set5, which have an initial code of "10000" of the binary search algorithm (binary search method) of FIG. 3, and supplies the signals to the upper-bit setting circuit (UBS) 26.

Therefore, at Step 0 of FIG. 12, the initial code "10000" can be stored in the first to fifth flip-flops FF1-FF5 of the successive approximation register (SAR) 22 in response to the first clock signal cks0 from the control clock generating circuit (CCG) 23.

Thereafter, as in the case of FIG. 6, the phase-comparison output FD$_{out}$ is stored in the first to fifth flip-flops FF1-FF5 of the successive approximation register (SAR) 22 at Step 1 to Step 5 as shown in FIG. 12 respectively.

Thus, in the case of FIG. 12, no initial setting is executed on the successive approximation register 22 at Step 0. However, setting of the set delay stage umber N of the digital control oscillator 10 on the first to fifth flip-flops FF1-FF5 of the successive approximation register (SAR) 22 can be completed until Step 5.

<<Other Configuration of PLL>>

The invention can be applied to a clock generating circuit i.e. PLL (Phase Locked Loop), which is different in configuration from FLL including PC (Program Counter) 32 used as a variable multiplier.

FIG. 17 is a diagram showing a basic configuration of PLL according to another embodiment of the invention.

As shown in FIG. 17, PLL shown in FIG. 17 includes a fixed divider with its division ratio M fixed as a replacement for the program counter 32 serving as a variable multiplier in FLL shown in FIG. 7. By way of compensation for that, PLL of FIG. 17 is arranged so that the frequency f$_{REF}$ of the input clock signal CLK$_{in}$ which is supplied to one input terminal of the phase-frequency comparator 31 and used as a reference frequency signal can be changed among High (High speed), Middle (Middle speed) and Low (Low speed).

To make possible for PLL shown in FIG. 17 to conduct a lock operation even when the frequency f$_{REF}$ of the input clock signal CLK$_{in}$ is changed among High, Middle and Low, the set delay stage umber N of the digital control oscillator 10 must be changed among Small, Medium and Large in step with the change of the frequency f$_{REF}$ of the input clock signal CLK$_{in}$ among High, Middle and Low, as is clear from Expression 4.

To reduce the number of steps to store digital control information in the successive approximation register (SAR) for digitally controlling the set delay stage umber N of the digital control oscillator 10 operable to make PLL lock, the information about which of High, Middle and Low the frequency f$_{REF}$ of the input clock signal CLK$_{in}$ corresponds to is supplied to the control data storing circuit (LUT) 25. The Control data storing circuit (LUT) 25 outputs an upper bit of the set delay stage umber N of the digital control oscillator 10, which is Small, Medium or Large, and corresponds to the frequency f$_{REF}$ of the input clock signal CLK$_{in}$. The upper bit thus output is set as initial data on the flip-lop for the upper bit in the successive approximation register (SAR) 22.

After initial setting on the flip-flop of the upper bit in the successive approximation register (SAR) 22, digital control information is stored in turn in the flip-flops for the lower bits in the successive approximation register (SAR) according to the binary search algorithm, and then the procedure for the lock operation by PLL of FIG. 17 is completed.

Further, in PLL taking a second configuration, the divider as shown in FIG. 17 is a variable divider whose division ratio M can be varied among High, Middle and Low. By way of compensation for that, the frequency f$_{REF}$ of the input clock signal CLK$_{in}$ used as a reference frequency signal supplied to one input terminal of the phase-frequency comparator 31 takes a fixed value. In case that the digital control oscillator 10 is arranged so that the set delay stage umber N thereof is changed among Small, Medium and Large in inverse proportion to the division ratio M set variably, the frequency of the oscillation clock CLKm is varied among High, Middle and Low. Also, in this case, in the same way as described above, the steps to store digital control information can be reduced by initial setting on an upper bit of the successive comparison register (SAR) 22.

<<Configuration of the Control Data Storing Circuit >>

Figure 14:
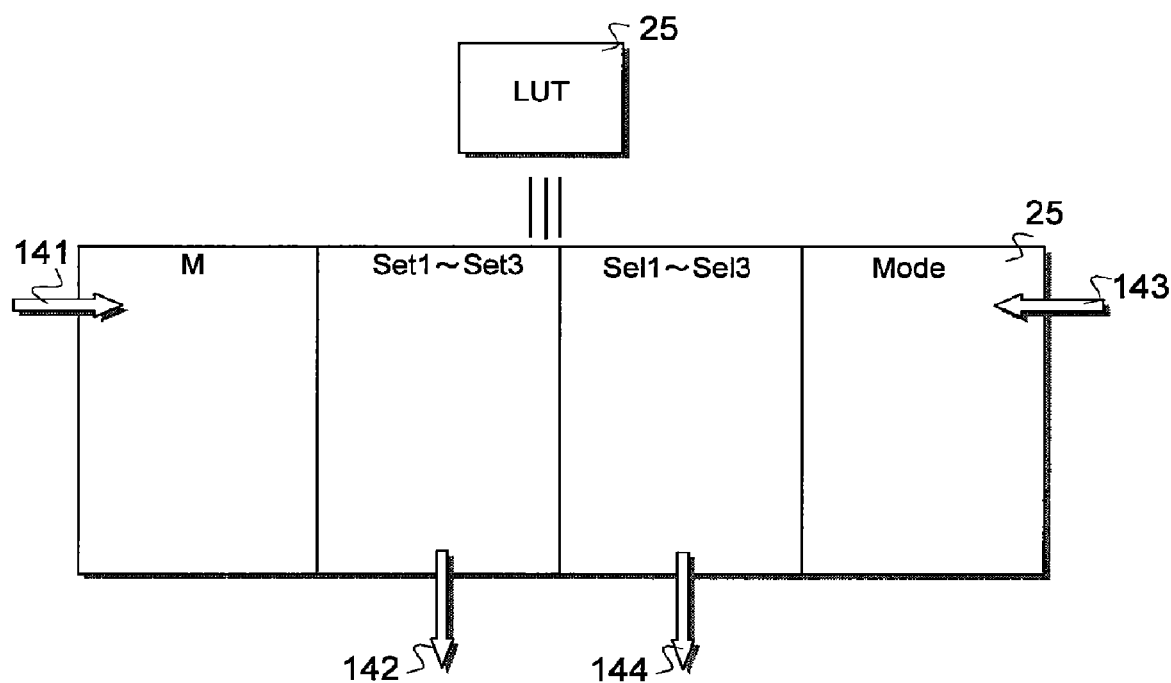
FIG. 14 is a diagram showing a configuration of the control data storing circuit of the digital control part of FLL as shown in FIG. 7 according to an embodiment of the invention.

FIG. 14 is a diagram showing a configuration of the control data storing circuit (LUT) 25 of the digital control part 20 of FLL or PLL according to an embodiment of the invention; the FLL and PLL are shown in FIG. 7 and FIG. 17.

As shown in FIG. 14, the control data storing circuit (LUT) 25 includes a storage region for a variable multiplication number or variable division number M, a storage region for initial setting control signals Set1-Set3, a storage region for select signals Sel1-Sel3 and a storage region for an operation mode Mode.

A multiplication number or division number 141 supplied to the input terminal Min for setting a multiplication number or division number in FLL or PLL shown in FIG. 7 or 17 is put into the storage region for a variable multiplication number or division number M in the control data storing circuit (LUT) 25. Then, initial setting control signals (Set1-Set3) 142 corresponding to the multiplication number or division number 141 arise from the storage region for select signals Sel1-Sel3 in the control data storing circuit (LUT) 25. In case that the variable multiplication number or variable division number (M) 141 is between 15 and 10, the initial setting control signals (Set1-Set3) 142 make the initial set data "000". In case that the variable division number (M) 141 is between 10 and 7, the initial setting control signals (Set1-Set3) 142 make the initial set data "010". In case that the variable division number (M) 141 is between 7 and 5.5, the initial setting control signals (Set1-Set3) 142 make the initial set data "100". Further, in case that the variable division number (M) 141 is equal to or below 5.5, the initial setting control signals (Set1-Set3) 142 form the initial set data "110".

In the storage region for the operation mode Mode in the control data storing circuit (LUT) 25 of FIG. 14, first mode information, second mode information and third mode information are stored.

When information 143 corresponding to the first mode information is supplied to the storage region for the operation mode Mode, select signals 144 forming the data "100" arise from the storage region for select signals Sel1-Sel3 in the control data storing circuit 25; the data "100" shows that only the flip-flop FF1 for upper one bit is involved in initial setting on the successive approximation register (SAR) 22.

When information 143 corresponding to the second mode information is supplied to the storage region for the operation mode Mode, select signals 144 making the data "110" arise from the storage region for select signals Sel1-Sel3 in the control data storing circuit 25; the data "110" shows that the flip-flops FF1 and FF2 for upper two bits are involved in initial setting on the successive approximation register (SAR) 22.

When information 143 corresponding to the third mode information is supplied to the storage region for the operation mode Mode, select signals 144 forming the data "111" arise from the storage region for select signals Sel1-Sel3 in the control data storing circuit 25; the data "111" shows that the flip-flops FF1 and FF2 for upper two bits are involved in initial setting on the successive approximation register (SAR) 22.

The control data storing circuit (LUT) 25 as shown in FIG. 14 may be composed of a lookup table type random access memory. In a system initialization sequence of FLL or PLL according to an embodiment of the invention as shown in FIG. 7 or 17 at power-on, data in the storage regions of the control data storing circuit (LUT) 25 may be loaded from a nonvolatile memory of the system of the FLL or PLL.

<<Configuration of DLL>>

FIG. 15 is a diagram showing a basic configuration of DLL (delay locked loop) according to another embodiment of the invention.

In DLL as shown in FIG. 15, the delay ring oscillator of FLL of FIG. 7 is left out. By way of compensation for that, a digital control variable delay unit 10 is placed, which includes a digital control variable delay circuit 12 and an output buffer 13, and which delays an input clock signal $CLK_{in}$ supplied through an input buffer 15.

The input clock signal $CLK_{in}$ is supplied to one input terminal of the phase comparator (PD) 33 through an input buffer 15. An output clock signal $CLK_{out}$ from the output buffer 13 is supplied to the other input terminal of the phase comparator 33 through a feedback terminal CLKfb and another input buffer 16. Six bits of output data Q1-Q6 from the successive approximation register (SAR) 22 are supplied to six input terminals of the decoder 21. Sixty-four decode output signals from the decoder 21 are supplied to the digital control variable delay circuit 12 of the digital control variable delay unit 10.

With DLL of FIG. 15, the set delay stage umber N of the digital control variable delay circuit 12 can be set according to the binary search algorithm (binary search method) so that the input clock signal $CLK_{in}$ at the phase comparator 33 and the output clock signal $CLK_{out}$ are locked to each other. Specifically, in DLL of FIG. 15, the successive approximation register (SAR) 22 of the digital control part 20 of DLL is connected with a control clock generating circuit (CCG) 23 and a clock select circuit (CS) 24, and a control data storing circuit (LUT) 25 and a upper-bit setting circuit (UBS) 26, as in FLL of FIG. 7.

A delay-setting value supplied through a delay-setting input terminal Lin is further provide for the control data storing circuit (LUT) 25. In response to the setting value thus supplied, the control data storing circuit (LUT) 25 outputs an upper bit of a set delay stage umber N corresponding to the supplied setting value, which is set as initial data in the flip-flop for the upper bit in the successive approximation register (SAR) 22.

For example, the delay-setting value supplied through the delay-setting input terminal Lin includes information to identify which of Heavy, Middle and Light the value of the load capacitance $C_L$ on the output clock signal $CLK_{out}$ is. The output delay amount produced by the output buffer 13 and load capacitance $C_L$ is changed among Large, Medium and Small depending on which of Heavy, Middle and Light the load capacitance $C_L$ on the output clock signal $CLK_{out}$ is. Therefore, the delay amount in the digital control variable delay circuit 12 must be controlled to be Small, Medium or Large. Hence, the control data storing circuit (LUT) 25 executes initial setting on the flip-flop for the upper bit in the successive approximation register (SAR) 22 so that the set delay stage umber N of the digital control variable delay circuit 12 is Small, Medium and Large according to the information to identify which of Heavy, Middle and Light the value of the load capacitance $C_L$ is.

Further, in case that DLL is arranged so that the output driving power of the output buffer 13 can be changed among Large, Medium and Small, the output buffer 13 can be arranged as a variable delay module which can work providing an appropriate delay amount selected from among output delay amounts.

As in the case of the PLL taking the second configuration according to the invention as described above, in DLL according to another embodiment of the invention, the frequency $f_{REF}$ of the input clock signal $CLK_{in}$ used as a reference frequency signal supplied to the one input terminal of the phase comparator 33 can be changed among High, Middle and Low. In case that a delay time produced by the digital control variable delay circuit 12 and output buffer 13 of the digital control variable delay unit 10 in DLL of FIG. 15 is coincident with the cycle of the frequency $f_{REF}$ of the input clock signal $CLK_{in}$, DLL of FIG. 15 can execute the lock operation.

The cycle of the frequency $f_{REF}$ of the input clock signal $CLK_{in}$ is varied among Short, Middle and Long by changing the frequency $f_{REF}$ of the input clock signal $CLK_{in}$ among High, Middle and Low. Therefore, the delay time produced by digital control variable delay circuit 12 and output buffer 13 of the digital control variable delay unit 10 in DLL of FIG. 15 must be changed among Short, Middle and Long in response to the change of the frequency $f_{REF}$ of the input clock signal $CLK_{in}$ among High, Middle and Low.

To reduce the number of steps to store digital control information in the successive approximation register (SAR) for digitally controlling the set delay stage umber N of the digital control variable delay unit 10 operable to make DLL of FIG. 15 lock, the information about which of High, Middle and Low the frequency $f_{REF}$ of the input clock signal $CLK_{in}$ corresponds to is supplied to the control data storing circuit (LUT) 25. The Control data storing circuit (LUT) 25 outputs an upper bit of the set delay stage umber N of the digital control variable delay unit 10, which is Small, Medium or Large, and corresponds to the frequency $f_{REF}$ of the input clock signal $CLK_{in}$. The upper bit thus output is set as initial data on the flip-lop for the upper bit in the successive approximation register (SAR) 22.

After initial setting on the flip-flop of the upper bit in the successive approximation register (SAR) 22, digital control information is stored in turn in the flip-flops for the lower bits in the successive approximation register (SAR) according to the binary search algorithm, and then the procedure for the lock operation by DLL of FIG. 15 is completed.

<<System On Chip>>

FIG. 16 is a diagram showing a SoC (System On Chip) 100 which incorporates, as a clock-supplying circuit 60 of a core circuit block 42, one of the FLL of FIG. 7, DLL of FIG. 15 and digital control PLL of FIG. 17.

In SOC of FIG. 16, an input clock signal $CLK_{in}$ of a low frequency formed by an oscillator 41 connected with a quartz oscillator 40 outside the LSI can be directly supplied to an analog PLL 421 of the core circuit block 42 through a selector 61. Also, in SOC of FIG. 16, when the low-frequency input clock signal $CLK_{in}$ formed by the oscillator 41 is supplied to the clock-supplying circuit 60, the clock-supplying circuit 60 forms a clock of a high frequency, and therefore the high-frequency clock can be supplied to the analog PLL 421 of the core circuit block 42 through the selector 61.

To achieve larger scale integration and higher functionality, a conventional SoC (System On Chip) requires outputting operation clocks at a ultra high speed e.g. over 500 MHz approximately. However, the frequency multiplication number of an analog PLL incorporated in SoC is limited to roughly several-fold to several tens-fold in general. Therefore, an input reference clock signal supplied to an analog PLL has a high frequency ranging from several to several tens of megahertz. To supply an input reference clock signal of a high frequency to an analog PLL incorporated in SoC, an expensive quartz oscillator is needed.

However, a low-cost quartz oscillator 40 is connected to the oscillator 41 of the SoC (System On Chip) 100 containing FLL, PLL or DLL as the clock-supplying circuit 60, as shown in FIG. 16. The oscillator 41 oscillates an oscillation clock signal $CLK_{in}$ having a frequency as low as about 30 kHz. Although the multiplication factor of the analog PLL 421 in the core circuit block 42 is as small as 10, FLL, PLL or DLL is adopted as the clock-supplying circuit 60, and the variable multiplication number or division number M of the program counter (PC) 32 of the clock-supplying circuit 60 is set to the maximum 2047. Therefore, the clock-supplying circuit 60 outputs a high-speed operation clock signal $CLK_{out}$ of about 60 MHz. As a result, the analog PLL 421 having a frequency multiplication factor of 10 in the core circuit block 42 forms an ultrahigh-speed operation clock signal $CLK_{out}$ of about 600 MHz. Hence, the core circuit block 42, to which the ultra-high-speed operation clock signal $CLK_{out}$ of about 600 MHz, can execute an ultrahigh-speed operation.

In case that the variable multiplication number or variable division number M of the program counter (PC) 32 in the clock-supplying circuit 60 is set to the half value 1028, the clock-supplying circuit 60 outputs a middle-speed operation clock signal $CLK_{out}$ of about 30 MHz. As a result, the analog PLL 421 having a frequency multiplication factor of 10 in the core circuit block 42 forms a high-speed operation clock signal $CLK_{out}$ of about 300 MHz. The core circuit block 42 and peripheral module 43, to which the high-speed operation clock signal $CLK_{out}$ of about 300 MHz is supplied, can execute a high-speed operation.

In case that the variable multiplication number or variable or variable division number M of the program counter (PC) 32 in the clock-supplying circuit 60 is set to the tenth 205, the clock-supplying circuit 60 outputs a low-speed operation clock signal $CLK_{out}$ of about 6 MHz. As a result, the analog PLL 421 having a frequency multiplication factor of 10 in the core circuit block 42 forms a low-speed operation clock signal $CLK_{out}$ of about 60 MHz. The core circuit block 42, to which the low-speed operation clock signal $CLK_{out}$ of about 60 MHz is supplied, can execute a low-speed operation. Now, it is noted that the core circuit block 42 further includes a central processing unit 422, an internal RAM 423, and a functional block 424, in addition to the analog PLL 421. Further, the peripheral module 43 includes a logic part 431, a functional block 432, a built-in ROM 433 and an interface part 434.

As the quartz oscillator 40 connected with the oscillator 41, an expensive quartz oscillator which resonates with an RF frequency of about 60 MHz may be adopted. In this case, a combination of the quartz oscillator 40 and oscillator 41 oscillates a high-speed operation oscillation clock signal $CLK_{in}$ of about 60 MHz. The clock control part 50 controls the selector 61 thereby to supply a high-speed operation oscillation clock signal $CLK_{in}$ of about 60 MHz to the core circuit block 42.

The invention made by the inventor has been described above based on the embodiments specifically. However, the invention is not limited to them. It will be obvious that various changes and modifications may be made without departing from the subject matter hereof.

For example, with FLL as shown in FIG. 7, an oscillator including lots of digitally-controlled quantized capacitances in the LC-tank as described in "Digitally Controlled Oscillator (DCO) -Based Architecture for RF Frequency Synthesis in a Deep-Submicron CMOS Process" presented by Robert Bogdan Staszewski et al. may be adopted instead of the delay ring oscillating part including the two-input NAND gate 11 and digital control variable delay circuit 12 of the digital control oscillator 10.

Further, an oscillator that the delay amount is controlled by controlling a current value of operation current of a fixed number of delay cells constituting a delay ring instead of controlling the number of stages of the delay cells constituting the delay ring may be adopted. The operation current of the delay cells can be controlled by a D/A converter of current output type such that operation current of the delay cells is output in response to digital control information Q1-Q5 from the successive approximation register (SAR) 22 in the digital control part 20.

In addition, as a measure taken in case that upper bits of the set delay stage umbers of the successive approximation register corresponding to all the division numbers M supplied through the division number setting input terminal cannot be stored in the control data storing circuit because of the restriction on the memory capacity of control data storing circuit, an initial code according to other suitable search method other than the binary search algorithm may be set.

Moreover, the control data storing circuit (LUT) 25 may be composed of a nonvolatile memory such as a built-in flash memory of LSI except a lookup table type random access memory. By making such arrangement, a task for loading from a nonvolatile memory of the system into a lookup table type RAM can be omitted from a system initialization sequence of FLL, PLL or DLL at power-on.

What is claimed is:

1. A semiconductor integrated circuit comprising
   a clock generating section having a digital control delay unit operable to delay a reference signal thereby to generate a delay clock signal, and
   a digital control part operable to control at least one of a phase and frequency of the delay clock signal generated by the digital control delay unit,
   wherein the clock generating section includes a comparator, a control register and an output buffer,
   when the delay clock signal generated by the digital control delay unit is supplied to an input terminal of the output buffer, an output clock signal arises from an output terminal of the output buffer,
   the reference signal is supplied to one input terminal of the comparator, and the output clock signal arising from the output buffer is supplied to the other input terminal of the comparator,
   when the control register is supplied with an output signal of the comparator, the control register stores two or larger bits of digital control information for controlling the digital control delay unit,
   the comparator, control register and digital control delay unit constitute a delay locked loop,
   when the control register stores digital control information having a predetermined value, at least one of a phase and frequency of the output clock signal at the other input terminal of the comparator is locked to at least one of a phase and frequency of the reference signal at the one input terminal of the comparator,
   the delay locked loop can work in two or more operation conditions by setting two or more frequencies for the reference signal or setting two or more delay amounts for the output buffer,
   the delay locked loop works in one operation condition selected from among the two or more operation conditions by setting one frequency selected from among the two or more frequencies for the reference signal, or setting one delay amount selected from among the two or more delay amounts for the output buffer,
   the clock generating section further includes a control data storing circuit connected with the control register,
   sets of initial set data for operation by the delay locked loop in the two or more operation conditions can be stored in the control data storing circuit in advance,
   operation select information for selecting the one operation condition is supplied to the control data storing circuit prior to an operation by the delay locked loop in the one operation condition, and
   initial set data for the operation in the one operation condition is stored at an upper bit of the control register from the control data storing circuit in response to the operation select information.

2. The semiconductor integrated circuit according to claim 1, wherein the output signal of the comparator is supplied to lower bits other than the upper bit of the control register during the operation in the one operation condition.

3. The semiconductor integrated circuit according to claim 2, wherein the clock generating section further includes a control clock generating circuit operable to generate multi-clock control signals mutually differing in phase in response to the reference signal,
   the control data storing circuit responds to the operation select information to generate select signals indicating an upper bit of the control register in which the initial set data is to be stored,
   the initial set data is stored at the upper bit of the control register specified by the select signals in keeping with timing of the first clock control signal of the multi-clock control signals generated by the control clock generating circuit, and
   the output signal of the comparator is supplied to the lower bits of the control register in keeping with timings of the clock control signals subsequent to the first clock control signal of the multi-clock control signals generated by the control clock generating circuit.

4. The semiconductor integrated circuit according to claim 2, wherein the output buffer is arranged as a variable delay module which can work providing an appropriate delay amount selected from among the two or more delay amounts, and the operation select information is for selecting the appropriate delay amount of the output buffer arranged as the variable delay module.

5. The semiconductor integrated circuit according to claim 2, wherein the digital control delay unit includes a digital control variable delay circuit which can be controlled in delay stage number by the two or larger bits of digital control information of the control register.

6. The semiconductor integrated circuit according to claim 2, wherein the output clock signal arising from the output buffer of the delay locked loop is supplied to an internal circuit of a semiconductor chip as an operation clock.

* * * * *